(12) United States Patent
Dyvorne et al.

(10) Patent No.: US 12,189,014 B2
(45) Date of Patent: Jan. 7, 2025

(54) EDDY CURRENT MITIGATION SYSTEMS AND METHODS

(71) Applicant: Hyperfine Operations, Inc., Guilford, CT (US)

(72) Inventors: Hadrien A. Dyvorne, New York, NY (US); Cedric Hugon, Guilford, CT (US); Rafael O'Halloran, Guilford, CT (US); Laura Sacolick, Guilford, CT (US)

(73) Assignee: Hyperfine Operations, Inc., Guilford, CT (US)

( * ) Notice: Subject to any disclaimer, the term of this patent is extended or adjusted under 35 U.S.C. 154(b) by 0 days.

(21) Appl. No.: 18/321,708

(22) Filed: May 22, 2023

(65) Prior Publication Data

US 2023/0324489 A1     Oct. 12, 2023

Related U.S. Application Data

(63) Continuation of application No. 16/994,005, filed on Aug. 14, 2020, now Pat. No. 11,698,430.
(Continued)

(51) Int. Cl.
  *G01R 33/565*   (2006.01)
  *G01R 33/44*    (2006.01)
  *G01R 33/58*    (2006.01)

(52) U.S. Cl.
  CPC ....... *G01R 33/56518* (2013.01); *G01R 33/58* (2013.01); *G01R 33/445* (2013.01)

(58) Field of Classification Search
  CPC .......... G01R 33/3852; G01R 33/56518; G01R 33/56572
  See application file for complete search history.

(56) References Cited

U.S. PATENT DOCUMENTS

| 4,980,641 A | 12/1990 | Breneman et al. |
| 5,126,672 A | 6/1992 | Le Roux |

(Continued)

FOREIGN PATENT DOCUMENTS

| CN | 1258001 A | 6/2000 |
| CN | 1336558 A | 2/2002 |

(Continued)

OTHER PUBLICATIONS

Eichler, et al., "Implementation of the First Order Reversal Curve Method for Identification of Weight Function in Preisach Model for Ferromagnetics," ELEKTRO 11th International Conference; IEEE; pp. 602-607; May 16-18, 2016 (15 pages).

(Continued)

*Primary Examiner* — Steven L Yeninas
(74) *Attorney, Agent, or Firm* — Foley & Lardner LLP

(57) ABSTRACT

Techniques for compensating for presence of eddy currents during the operation of a magnetic resonance imaging (MRI) system in accordance with a pulse sequence, the pulse sequence comprising a gradient waveform associated with a target gradient field. The techniques include: compensating for presence of eddy currents during operation of the MRI system at least in part by correcting the gradient waveform using a nonlinear function of a characteristic of the gradient waveform to obtain a corrected gradient waveform; and operating the MRI system in accordance with the corrected gradient waveform to generate the target gradient field.

20 Claims, 19 Drawing Sheets

Related U.S. Application Data

(60) Provisional application No. 62/887,212, filed on Aug. 15, 2019.

(56) References Cited

U.S. PATENT DOCUMENTS

| | | | |
|---|---|---|---|
| 5,227,728 | A | 7/1993 | Kaufman et al. |
| 5,250,901 | A | 10/1993 | Kaufman et al. |
| 5,332,969 | A | 7/1994 | Tsuruno et al. |
| 5,652,517 | A | 7/1997 | Maki et al. |
| 5,864,233 | A | 1/1999 | Zhou et al. |
| 6,191,582 | B1 | 2/2001 | Zur |
| 6,201,987 | B1 * | 3/2001 | Dumoulin ............ G01R 33/285 324/318 |
| 6,291,997 | B1 | 9/2001 | King et al. |
| 6,335,620 | B1 | 1/2002 | Weissenberger |
| 6,392,411 | B1 | 5/2002 | Goto |
| 6,437,566 | B1 | 8/2002 | Heid |
| 6,483,305 | B1 | 11/2002 | Miyamoto |
| 9,541,616 | B2 | 1/2017 | Rothberg et al. |
| 9,547,057 | B2 | 1/2017 | Rearick et al. |
| 9,625,544 | B2 | 4/2017 | Poole et al. |
| 9,645,210 | B2 | 5/2017 | McNulty et al. |
| 9,817,093 | B2 | 11/2017 | Rothberg et al. |
| 10,145,913 | B2 | 12/2018 | Hugon et al. |
| 10,145,922 | B2 | 12/2018 | Rothberg et al. |
| 10,222,434 | B2 | 3/2019 | Poole et al. |
| 10,274,561 | B2 | 4/2019 | Poole et al. |
| 10,281,540 | B2 | 5/2019 | Mileski et al. |
| 10,281,541 | B2 | 5/2019 | Poole et al. |
| 10,310,037 | B2 | 6/2019 | McNulty et al. |
| 10,416,264 | B2 | 9/2019 | Sofka et al. |
| 10,551,452 | B2 | 2/2020 | Rearick et al. |
| 10,591,561 | B2 | 3/2020 | Sacolick et al. |
| 10,709,387 | B2 | 7/2020 | Poole et al. |
| 11,156,688 | B2 | 10/2021 | O'Halloran et al. |
| 2001/0041819 | A1 | 11/2001 | Goto |
| 2002/0097049 | A1 | 7/2002 | Goto |
| 2004/0046554 | A1 * | 3/2004 | Carlini ............ G01R 33/56518 324/309 |
| 2006/0192558 | A1 | 8/2006 | Miyawaki et al. |
| 2010/0148774 | A1 | 6/2010 | Kamata |
| 2012/0098535 | A1 | 4/2012 | Kaneta et al. |
| 2013/0154642 | A1 | 6/2013 | Sueoka |
| 2013/0187650 | A1 | 7/2013 | Pfeuffer et al. |
| 2013/0234708 | A1 * | 9/2013 | Goora .................. G01R 33/54 324/309 |
| 2014/0125333 | A1 * | 5/2014 | Hanada ............ G01R 33/56572 324/318 |
| 2014/0218031 | A1 | 8/2014 | Lee et al. |
| 2015/0008921 | A1 * | 1/2015 | Lee .................. G01R 33/387 324/309 |
| 2016/0128592 | A1 | 5/2016 | Rosen et al. |
| 2016/0131727 | A1 | 5/2016 | Sacolick et al. |
| 2016/0245891 | A1 | 8/2016 | Ookawa |
| 2018/0238978 | A1 | 8/2018 | McNulty et al. |
| 2019/0038233 | A1 | 2/2019 | Poole et al. |
| 2019/0324098 | A1 | 10/2019 | McNulty et al. |
| 2019/0353723 | A1 | 11/2019 | Dyvorne et al. |
| 2019/0353726 | A1 | 11/2019 | Poole et al. |
| 2020/0022611 | A1 | 1/2020 | Nelson et al. |
| 2020/0022612 | A1 | 1/2020 | McNulty et al. |
| 2020/0034998 | A1 | 1/2020 | Schlemper et al. |
| 2020/0041588 | A1 | 2/2020 | O'Halloran et al. |
| 2020/0045112 | A1 | 2/2020 | Sacolick et al. |
| 2020/0058106 | A1 | 2/2020 | Lazarus et al. |
| 2020/0200844 | A1 | 6/2020 | Boskamp et al. |
| 2020/0209334 | A1 | 7/2020 | O'Halloran et al. |
| 2020/0209335 | A1 | 7/2020 | O'Halloran et al. |
| 2020/0289019 | A1 | 9/2020 | Schlemper et al. |
| 2020/0289022 | A1 | 9/2020 | Coumans et al. |
| 2020/0294229 | A1 | 9/2020 | Schlemper et al. |
| 2020/0294282 | A1 | 9/2020 | Schlemper et al. |
| 2020/0294287 | A1 | 9/2020 | Schlemper et al. |
| 2020/0337587 | A1 | 10/2020 | Sacolick et al. |
| 2020/0355765 | A1 | 11/2020 | Chen et al. |
| 2021/0048498 | A1 | 2/2021 | Dyvorne et al. |
| 2022/0043094 | A1 | 2/2022 | O'Halloran et al. |

FOREIGN PATENT DOCUMENTS

| | | |
|---|---|---|
| CN | 1374069 A | 10/2002 |
| EP | 1004892 A1 | 5/2000 |
| EP | 1197760 A2 | 4/2002 |
| JP | H09-10186 A | 1/1997 |

OTHER PUBLICATIONS

First Office Action and Search Report on CN App. No. 201980093021.3 dated Oct. 27, 2023 (with English translation, 29 pages).
Invitation to Pay Additional Fees for International Application No. PCT/US2019/061663 mailed Mar. 5, 2020.
International Search Report and Written Opinion for International Application No. PCT/US2019/061663 mailed Jun. 24, 2020.
International Search Report and Written Opinion for International Application No. PCT/US2020/046445 mailed Dec. 3, 2020.
International Preliminary Report on Patentability for International Application No. PCT/US2019/061663 mailed Jul. 8, 2021.
International Preliminary Report on Patentability for International Application No. PCT/US2020/046445 mailed Dec. 3, 2020.
De Zanche et al., NMR probes for measuring magnetic fields and field dynamics in MR systems. Magnetic Resonance in Medicine: An Official Journal of the International Society for Magnetic Resonance in Medicine. Jul. 2008;60(1):176-86.
Li et al., Finite element analysis of gradient z-coil induced eddy currents in a permanent MRI magnet. Journal of Magnetic Resonance. Jan. 1, 2011;208(1):148-55.
Novak et al., Difficulty in identification of Preisach hysteresis model weighting function using first order reversal curves method in soft magnetic materials. Applied Mathematics and Computation. Feb. 15, 2018;319:469-85.
Van Vaals et al., Optimization of eddy-current compensation. Journal of Magnetic Resonance (1969). Oct. 15, 1990;90(1):52-70.
Wansapura et al., Temperature mapping of frozen tissue using eddy current compensated half excitation RF pulses. Magnetic Resonance in Medicine: An Official Journal of the International Society for Magnetic Resonance in Medicine. Nov. 2001;46(5):985-92.

* cited by examiner

EDDY CURRENT MITIGATION SYSTEMS AND METHODS

CROSS REFERENCE TO RELATED APPLICATIONS

This application is a continuation of and claims priority under 35 U.S.C. § 120 to U.S. application Ser. No. 16/994,005, titled "EDDY CURRENT MITIGATION SYSTEMS AND METHODS", filed on Aug. 14, 2020, which claims priority under 35 U.S.C. § 119(e) to U.S. Provisional Patent Application Ser. No. 62/887,212, titled "EDDY CURRENT MITIGATION SYSTEMS AND METHODS", filed on Aug. 15, 2019, each of which is incorporated by reference in its entirety herein.

BACKGROUND

Magnetic resonance imaging (MRI) provides an important imaging modality for numerous applications and is widely utilized in clinical and research settings to produce images of the inside of the human body. As a generality, MRI is based on detecting magnetic resonance (MR) signals, which are electromagnetic waves emitted by atoms in response to state changes resulting from applied electromagnetic fields. For example, nuclear magnetic resonance (NMR) techniques involve detecting MR signals emitted from the nuclei of excited atoms upon the re-alignment or relaxation of the nuclear spin of atoms in an object being imaged (e.g., atoms in the tissue of the human body). Detected MR signals may be processed to produce images, which in the context of medical applications, allows for the investigation of internal structures and/or biological processes within the body for diagnostic, therapeutic and/or research purposes.

SUMMARY

Some embodiments are directed to a method for operating a magnetic resonance imaging (MRI) system by generating a target gradient field in accordance with a pulse sequence, the pulse sequence comprising a gradient waveform associated with the target gradient field. The method comprises: compensating for presence of eddy currents during operation of the MRI system at least in part by correcting the gradient waveform using a nonlinear function of a characteristic of the gradient waveform to obtain a corrected gradient waveform; and operating the MRI system in accordance with the corrected gradient waveform to generate the target gradient field.

Some embodiments are directed to at least one non-transitory computer-readable storage medium storing processor-executable instructions that, when executed by an MRI system, cause the MRI system to perform a method of operating the MRI system by applying a plurality of gradient fields in accordance with a pulse sequence, the pulse sequence comprising a gradient waveform associated with a target gradient field. The method comprises: compensating for presence of eddy currents during operation of the MRI system at least in part by correcting the gradient waveform using a nonlinear function of a characteristic of the gradient waveform to obtain a corrected gradient waveform; and operating the MRI system in accordance with the corrected gradient waveform to generate the target gradient field.

Some embodiments are directed to an MRI system, comprising: a magnetics system comprising a plurality of magnetics components configured to produce magnetic fields for performing MRI, the plurality of magnetics components including at least one gradient coil for producing a gradient magnetic field; and at least one controller configured to operate one or more of the plurality of magnetics components in accordance with a pulse sequence, the pulse sequence comprising a gradient waveform associated with the target gradient field. The at least one controller is configured to: compensate for presence of eddy currents during operation of the MRI system at least in part by correcting the gradient waveform using a nonlinear function of a characteristic of the gradient waveform to obtain a corrected gradient waveform; and operate the MRI system in accordance with the corrected gradient waveform to generate the target gradient field.

Some embodiments are directed to an MRI system, comprising at least one controller configured to operate one or more of the plurality of magnetics components in accordance with a pulse sequence, the pulse sequence comprising a gradient waveform associated with the target gradient field. The at least one controller is configured to: compensate for presence of eddy currents during operation of the MRI system at least in part by correcting the gradient waveform using a nonlinear function of a characteristic of the gradient waveform to obtain a corrected gradient waveform; and operate the MRI system in accordance with the corrected gradient waveform to generate the target gradient field.

Some embodiments are directed to a method of operating an MRI system, the MRI system including at least one radio frequency (RF) coil configured to apply an RF signal in accordance with a pulse sequence, the pulse sequence comprising a gradient waveform associated with a target gradient field and an RF waveform associated with a target RF signal. The method comprises: compensating for the presence of eddy currents during operation of the MRI system at least in part by correcting the RF waveform to obtain a corrected RF waveform. The correcting comprises: determining a shifted $B_0$ magnetic field strength waveform based on a corrected gradient waveform obtained at least in part by applying a first nonlinear function of a characteristic of the gradient waveform to the gradient waveform; and correcting the RF waveform using the shifted $B_0$ magnetic field strength waveform to obtain the corrected RF waveform. The method further comprises operating the MRI system in accordance with the corrected RF waveform to generate the target RF signal.

Some embodiments are directed to at least one non-transitory computer-readable storage medium storing processor-executable instructions that, when executed by an MRI system, cause the MRI system to perform a method of operating the MRI system by applying a plurality of RF signals in accordance with a pulse sequence, the pulse sequence comprising a gradient waveform associated with a target gradient field and an RF waveform associated with a target RF signal. The method comprises: compensating for the presence of eddy currents during operation of the MRI system at least in part by correcting the RF waveform to obtain a corrected RF waveform. The correcting comprises: determining a shifted $B_0$ magnetic field strength waveform based on a corrected gradient waveform obtained at least in part by applying a first nonlinear function of a characteristic of the gradient waveform to the gradient waveform; and correcting the RF waveform using the shifted $B_0$ magnetic field strength waveform to obtain the corrected RF waveform. The method further comprises operating the MRI system in accordance with the corrected RF waveform to generate the target RF signal.

Some embodiments are directed to an MRI system comprising: a magnetics system comprising a plurality of magnetics components configured to produce magnetic fields for performing MRI, the plurality of magnetics components including at least one radio frequency (RF) coil configured to apply an RF signal; and at least one controller configured to operate one or more of the plurality of magnetics components in accordance with a pulse sequence, the pulse sequence comprising a gradient waveform associated with a target gradient field and an RF waveform associated with a target RF signal. The at least one controller is configured to: compensate for the presence of eddy currents during operation of the MRI system at least in part by correcting the RF waveform to obtain a corrected RF waveform, the correcting comprising: determining a shifted $B_0$ magnetic field strength waveform based on a corrected gradient waveform obtained at least in part by applying a first nonlinear function of a characteristic of the gradient waveform to the gradient waveform; and correcting the RF waveform using the shifted $B_0$ magnetic field strength waveform to obtain the corrected RF waveform. The at least one controller is further configured to operate the MRI system in accordance with the corrected RF waveform to generate the target RF signal.

Some embodiments are directed to an MRI system comprising at least one controller configured to operate one or more of the plurality of magnetics components in accordance with a pulse sequence, the pulse sequence comprising a gradient waveform associated with a target gradient field and an RF waveform associated with a target RF signal. The at least one controller is configured to: compensate for the presence of eddy currents during operation of the MRI system at least in part by correcting the RF waveform to obtain a corrected RF waveform, the correcting comprising: determining a shifted $B_0$ magnetic field strength waveform based on a corrected gradient waveform obtained at least in part by applying a first nonlinear function of a characteristic of the gradient waveform to the gradient waveform; and correcting the RF waveform using the shifted $B_0$ magnetic field strength waveform to obtain the corrected RF waveform. The at least one controller is further configured to operate the MRI system in accordance with the corrected RF waveform to generate the target RF signal.

BRIEF DESCRIPTION OF DRAWINGS

Various aspects and embodiments will be described with reference to the following figures. It should be appreciated that the figures are not necessarily drawn to scale. In the drawings, each identical or nearly identical component that is illustrated in various figures is represented by a like numeral. For purposes of clarity, not every component may be labeled in every drawing.

DETAILED DESCRIPTION

Figure 1:
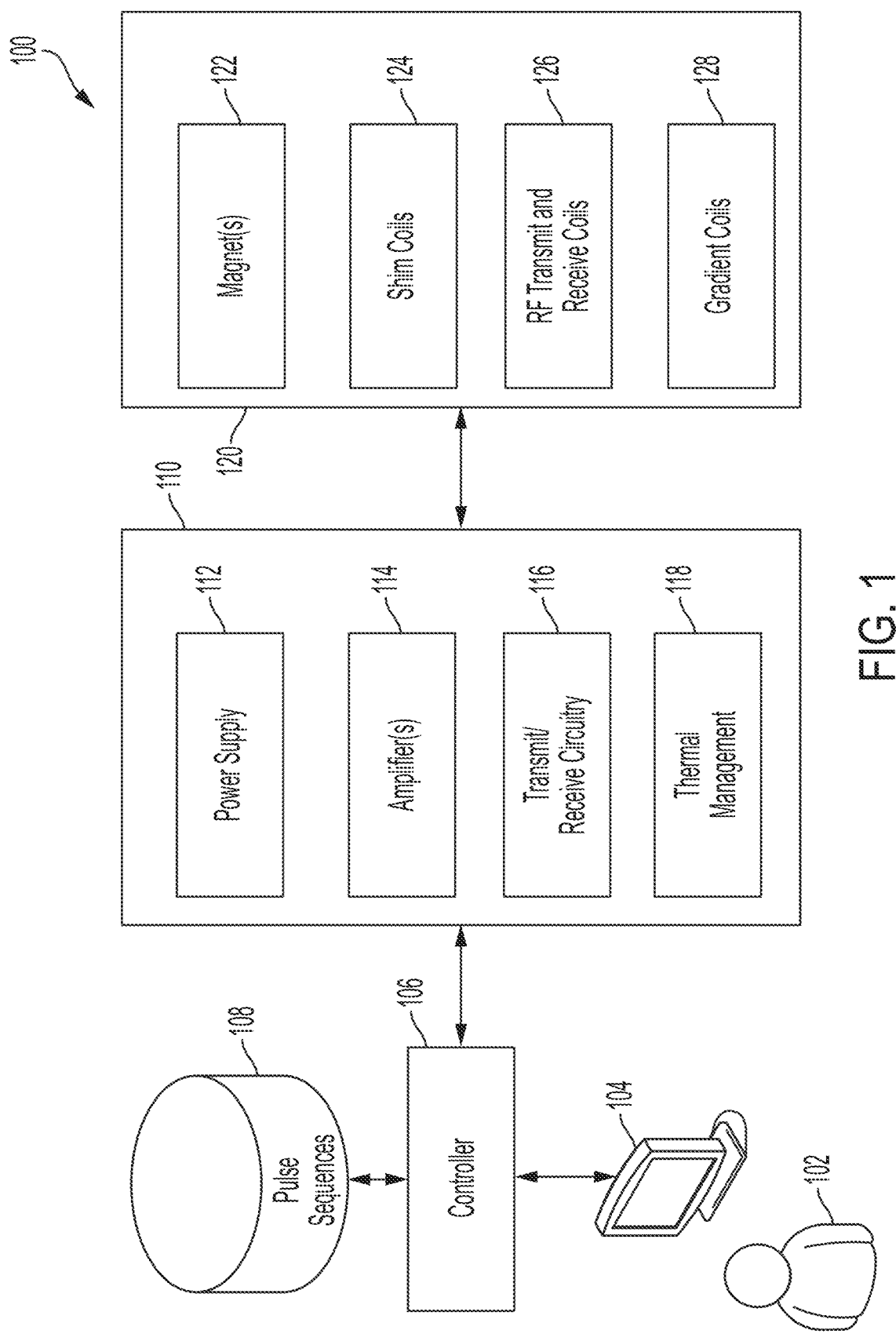
FIG. 1 illustrates exemplary components of a magnetic resonance imaging (MRI) system, in accordance with some embodiments of the technology described herein.

As discussed above, magnetic resonance imaging (MRI) is based on detecting magnetic resonance (MR) signals from spins associated with a subject, which are electromagnetic waves emitted by atoms in response to state changes resulting from applied electromagnetic fields. Accordingly, to acquire an MR image, an MRI system generates time-varying gradient magnetic fields to spatially encode MR signals within the subject as well as radio frequency (RF) signals to excite MR responses from spins within the subject. These time-varying electromagnetic fields can generate eddy currents within any conductive surfaces associated with the structure of the MRI system. Eddy currents are electrical currents induced within conductors by a changing magnetic field experienced by the conductor. Because eddy currents flow in closed loops, they generate opposing magnetic fields and accordingly can interfere with the acquisition of MR images. Correcting for presence of eddy currents within an MRI system is crucial for producing high-quality MR images because spurious eddy currents modify encoding or signal content of the MR acquisition, leading to artefacts in the acquired MR images. This is especially the case in low-field MRI systems, which are especially vulnerable to the adverse effects of eddy currents because of the lower signal-to-noise (SNR) of low-field MRI systems relative to conventional high-field systems.

Eddy current compensation and artefact mitigation can be achieved in part by correcting gradient fields generated by the MRI system. Gradient field eddy current compensation is commonly used in MRI systems with unshielded, partially shielded or imperfectly shielded gradient coils to correct for the response of metallic or other conductive structures around the gradient coils of the MRI system. One application that strongly relies on eddy current correction is diffusion weighted imaging (DWI), where strong diffusion gradients are applied just before smaller imaging gradients are applied. Additional applications that can benefit from eddy current correction is diffusion weighted steady-state free precession (DW-SSFP) imaging and fast spin echo (FSE) imaging.

Conventional eddy current correction methods assume a linear response of the MRI system to gradient field pulses, and thus apply a single correction filter to pre-emphasize the entire gradient waveform (e.g., by performing a multi-exponential convolution) and use the resulting pre-emphasized waveform to generate the target gradient field. Such conventional techniques therefore apply the single correction filter to the entire gradient waveform without taking into account any characteristics of the gradient waveform (e.g., its amplitude, slew rate, shape, etc.). The inventors have recognized and appreciated that nonlinear currents in an MRI system depend non-linearly on characteristics of the applied gradient fields. As a result, the inventors have recognized and appreciated that conventional eddy current linear compensation methods fail to adequately compensate for the non-linear eddy currents observed in practice.

Conventional eddy current correction methods model the relationship between gradient fields and resultant eddy currents as a linear time invariant system. By contrast, the inventors have developed improved eddy correction methods by modeling the relationship between gradient fields and resultant eddy currents as a time-varying system, and have implemented eddy current correction to counteract the effect of this time-varying systems on gradient fields generated from gradient waveforms by applying a non-linear scaling function (that is non-linear in the characteristic(s) of the gradient waveforms) to the gradient waveforms.

The inventors have developed systems and methods for mitigating and/or compensating for the effect of gradient field-induced eddy currents using a nonlinear approach in which: (1) a gradient waveform is corrected using a non-linear function of a characteristic of the gradient waveform to obtain a corrected gradient waveform; and (2) using the corrected gradient waveform to generate the target gradient field. Without such a correction, the generated gradient field (e.g., generating using the uncorrected gradient waveform) would result in a gradient field that differs from the target gradient field due to the presence of eddy currents.

Some embodiments provide for a method of operating a magnetic resonance imaging (MRI) system by generating a target gradient field in accordance with a pulse sequence, the pulse sequence comprising a gradient waveform associated with the target gradient field. The method includes compensating for the presence of eddy current effects during operation of the MRI system at least in part by correcting the gradient waveform using a nonlinear function of a characteristic of the gradient waveform to obtain a corrected gradient waveform. The method also includes operating the MRI system in accordance with the corrected gradient waveform to generate the target gradient field.

In some embodiments, the nonlinear function of a characteristic of the gradient waveform may be fitted to eddy current calibration data obtained from the MRI system and thereafter used to compensate the gradient waveform for the effects of eddy currents. For example, the nonlinear function may be dependent on an amplitude of the gradient waveform and determined based on eddy current calibration data acquired using a field probe to measure characteristics of the eddy currents in the MRI system. In some embodiments, the characteristic of the gradient waveform is an amplitude of the gradient waveform, a direction of the gradient waveform, a shape of the gradient waveform, and/or a slew rate of the gradient waveform.

In some embodiments, the nonlinear function may be any suitable function determined based on the eddy current calibration data. For example, the nonlinear function may be a polynomial function of the characteristic of the gradient waveform. In some embodiments, the nonlinear function may be an exponential function of the characteristic of the gradient waveform. In some embodiments, the nonlinear function may be a piecewise continuous function (e.g., piecewise constant, piecewise polynomial, piecewise exponential, etc.) of the characteristic of the gradient waveform.

In some embodiments, the nonlinear function may be used to correct the gradient waveform by applying the nonlinear function to the gradient waveform to obtain a scaled gradient waveform. For example, the gradient waveform may be multiplied by the nonlinear function to obtain the scaled gradient waveform. In some embodiments, a transformation (e.g., a pre-emphasis filter) may be applied to the scaled gradient waveform to obtain a transformed gradient waveform. The transformation may be determined based on additional eddy current calibration data obtained from the MRI system. For example, the additional eddy current calibration data may be obtained by measuring dissipation properties of the eddy currents created within the MRI system. In some embodiments, applying the transformation to the scaled gradient waveform may include filtering the scaled gradient waveform using a filter determined using the additional eddy current calibration data. In some embodiments, filtering of the scaled gradient waveform may be performed in a time domain. In some embodiments, the filter may be determined using an inverse Laplace transformation.

In some embodiments, the method includes subtracting the scaled gradient waveform from the transformed gradient waveform to obtain a correction gradient waveform and combining (e.g., adding) the correction gradient waveform with the gradient waveform to obtain a corrected gradient waveform.

In some embodiments, multiple nonlinear functions may be used to correct the gradient waveform. For example, a nonlinear function may be determined for each component of the eddy currents (e.g., for different time constants of the eddy currents). In such embodiments, applying the nonlinear functions to the gradient waveform may include applying each nonlinear function separately to the gradient waveform to obtain multiple scaled gradient waveforms. In some embodiments, the multiple scaled gradient waveforms, in combination with separately determined transformations, may be used to generate a plurality of correction waveforms. The plurality of correction waveforms may be combined with the gradient waveform to obtain the corrected gradient waveform.

The inventors have also developed systems and methods for using a piecewise approach to eddy current correction, which may be used in a variety of contexts including to implement non-linear correction in the context of diffusion-weighted imaging (DWI). The method uses a piecewise nonlinear function to separate the pulse sequence into sub-sequences, sorting out the gradient waveforms into each sub-sequence according to, for example, gradient waveform amplitude. Each sub-sequence is then corrected using an individual filter function that has been characterized in a calibration procedure performed at the gradient waveform amplitude corresponding to that sub-sequence.

In some embodiments, such methods are directed to operating a magnetic resonance imaging (MRI) system by generating a target gradient field in accordance with a pulse sequence, the pulse sequence comprising a gradient waveform associated with the target gradient field. The methods include compensating for the presence of eddy currents during operation of the MRI system at least in part by correcting the gradient waveform to obtain a corrected gradient waveform, the gradient waveform comprising a first portion and a second portion. The correcting includes applying a first eddy current correction to the first portion and applying a second eddy current correction to the second portion, wherein the second eddy current correction is different from the first eddy current correction. The methods also include operating the MRI system in accordance with the corrected gradient waveform to generate the target gradient field.

In some embodiments, the portions of the gradient waveform may be determined by a nonlinear, piecewise function of a characteristic of the gradient waveform. In some embodiments, the piecewise function may be defined by a threshold gradient amplitude such that a first portion of the gradient waveform comprises gradient waveforms having amplitudes less than or equal to the threshold amplitude and a second portion of the gradient waveform comprises gradient waveforms having amplitudes greater than the threshold amplitude. For example, the threshold amplitude may be a threshold percentage of the maximum gradient field amplitude of the MRI system (e.g., 70%, in a range from 60% to 80%). In some embodiments, the threshold gradient amplitude may be a threshold gradient field strength (e.g., in a range from 10 mT/m to 18 mT/m).

In some embodiments, the piecewise function may be defined by a direction of the gradient waveform. For example, the piecewise function may be defined such that a first portion of the gradient waveform comprises gradient waveforms having a first direction and a second portion of the gradient waveform comprises gradient waveforms having a second direction different than the first direction. In some embodiments, the portions of the gradient waveform may comprise gradient waveforms having opposing directions (e.g., in the −z and +z-directions) or perpendicular directions (e.g., in the x-, y-, and z-directions).

In some embodiments, the piecewise function may be defined by a shape of the gradient waveform. For example, the piecewise function may be defined such that a first portion of the gradient waveform comprises gradient waveforms having a first shape and a second portion of the gradient waveform comprises gradient waveforms having a second shape different than the first shape. The first shape and the second shape may include one of a trapezoidal gradient waveform shape, a rectangular gradient waveform shape, a Gaussian gradient waveform shape, or a sinusoidal gradient waveform shape, in some embodiments.

In some embodiments, the piecewise function may be defined by a slew rate of the gradient waveform. For example, the piecewise function may be defined such that a first portion of the gradient waveform comprises gradient waveforms having a first slew rate and a second portion of the gradient waveform comprises gradient waveforms having a second slew rate different than the first slew rate.

In some embodiments, correcting the gradient waveform may include applying a different eddy current correction for each portion of the gradient waveform as defined by the piecewise function. For example, when the piecewise function defines two portions of the gradient waveform, a first eddy current correction may be applied to the first portion using a first nonlinear function and a second eddy current correction may be applied to the second portion using a second nonlinear function.

In some embodiments, the first and second nonlinear functions may be determined using first and second eddy current calibration data, respectively. In some embodiments, the first and second nonlinear functions may be determined by acquiring the first and second eddy current calibration data for the MRI system (e.g., by using a field probe) and generating the first and second nonlinear functions based on the first and second eddy current calibration data. For example, the first and second nonlinear functions may be determined using a weighted linear combination of multiple exponential functions.

In some embodiments, applying the first and second eddy current corrections to the first portion and the second portion includes obtaining first and second transformations by applying an inverse Laplace transformation to the first and second nonlinear functions, respectively. Thereafter, the first and second transformations may be applied to the first and second portions to obtain the corrected first and second portions. A corrected gradient waveform may be obtained by combining the corrected first and second portions and/or operating the MRI system in accordance with the corrected first and second portions.

The inventors have further recognized that eddy current compensation and artefact mitigation can be further improved by correcting the operating frequency of RF components of the MRI system during a pulse sequence because the $B_0$ magnetic field strength may also be affected by eddy currents. The inventors have developed systems and methods for correcting the RF operating frequency (e.g., the transmit and/or receive frequency) using a nonlinear approach. In some embodiments, the method comprises operating an MRI system including at least one RF coil configured to apply an RF signal in accordance with a pulse sequence, the pulse sequence comprising a gradient waveform and an RF waveform associated with a target RF signal during the first period. The method includes compensating for the presence of eddy currents during operation of the MRI system at least in part by correcting the RF waveform to obtain a corrected RF waveform. The correcting includes determining a shifted $B_0$ magnetic field strength waveform based on a corrected gradient waveform obtained at least in part by applying a first nonlinear function of a characteristic of the gradient waveform to the gradient waveform and correcting the RF waveform using the shifted $B_0$ magnetic field strength waveform.

In some embodiments, determining the operating frequency function includes determining, using a nonlinear function of a characteristic of the $B_0$ field, a $B_0$ field strength function describing how the $B_0$ magnetic field changes in time during a pulse sequence. For example, the $B_0$ field strength function may be determined by applying a transformation to a corrected gradient waveform (e.g., a gradient waveform that has already been compensated for eddy currents). The transformation may be determined based on a nonlinear function of a characteristic of the $B_0$ field. For example, the transformation may be determined using an inverse Laplace transformation of the nonlinear function of a characteristic of the $B_0$ field. The nonlinear function of a characteristic of the $B_0$ field may be determined based on eddy current calibration data obtained, for example, by measuring how the $B_0$ field changes in response to the inducement and dissipation of eddy currents within the MRI system (e.g., by using a field probe) in response to applied gradient fields. In some embodiments, the nonlinear function of a characteristic of the $B_0$ field is a polynomial function or an exponential function.

In some embodiments, the $B_0$ field strength function may be used to determine an operating frequency of RF components of the MRI system. The $B_0$ magnetic field strength determines the Larmor frequency of precession of spins of the subject within the imaging region of the MRI system. As a result, the operating frequency of RF components of the MRI system is, ideally, close to or equivalent to the Larmor frequency to maximize receipt of MR signals form the subject. Accordingly, an operating frequency function may be determined based on the relationship between the $B_0$ field strength function and the Larmor frequency over the course of the pulse sequence.

The inventors have further recognized that eddy current compensation may be improved by including one or more additional preparation gradient field pulses prior to an initial pulse of a pulse sequence. Such preparation gradient field pulses can prepare the eddy current state of the MRI system prior to an MR image acquisition. When no preparation gradient field pulses are used, the different eddy current states of the MRI system can cause the initial and subsequent gradient field pulses of the pulse sequence to have an unbalanced gradient moment, which can introduce a phase mismatch in subsequent measurements. The preparation gradient field pulse(s) can balance the gradient moment associated with initial gradient field pulses of the pulse sequence.

In some embodiments, a method of acquiring magnetic resonance (MR) data using a magnetic resonance imaging (MRI) system is provided. The method includes applying one or more preparation gradient field pulses to a subject using the MRI system, and, after applying the one or more preparation gradient field pulses, operating the MRI system in accordance with a pulse sequence to acquire the MR data from the subject. In some embodiments, the pulse sequence is one of a DWI pulse sequence, a diffusion weighted steady-state free precession (DW-SSFP) pulse sequence, or a fast spin echo (FSE) pulse sequence.

In some embodiments, the one or more preparation gradient field pulses include a gradient field that is a same gradient field as an initial gradient field generated in accordance with the pulse sequence. For example, the preparation gradient field pulse may be a repetition of the first gradient field generated in accordance with a pulse sequence.

In some embodiments, the one or more preparation gradient field pulses include a gradient field that is approximately half as long as an initial gradient field generated in accordance with the pulse sequence. For example, in some pulse sequences (e.g., spin echo (SE), FSE pulse sequences) it may be desirable to have the spins in the imaging region refocus at the center of the echo readout period. In such embodiments, the preparation gradient field pulses may be configured to be half as long (e.g., having twice the frequency of) an initial gradient field of the pulse sequence in order to assist in proper refocusing of the spins at the center of the echo readout period.

In some embodiments, the one or more preparation gradient field pulses include a sequence of pulses of the gradient waveform. For example, in some embodiments including complex imaging gradient sequences, the preparation gradient field pulse may be a copy of part or all of the gradient waveform of the pulse sequence.

Following below are more detailed descriptions of various concepts related to, and embodiments of, techniques for eddy current correction. It should be appreciated that various aspects described herein may be implemented in any of numerous ways. Examples of specific implementations are provided herein for illustrative purposes only. In addition, the various aspects described in the embodiments below may be used alone or in any combination and are not limited to the combinations described explicitly herein.

As used herein, "high-field" refers generally to MRI systems presently in use in a clinical setting and, more particularly, to MRI systems operating with a main magnetic field (i.e., a $B_0$ field) at or above 1.5 T, though clinical systems operating between 0.5 T and 1.5 T are often also characterized as "high-field." Field strengths between approximately 0.2 T and 0.5 T have been characterized as "mid-field" and, as field strengths in the high-field regime have continued to increase, field strengths in the range between 0.5 T and 1 T have also been characterized as mid-field. By contrast, "low-field" refers generally to MRI systems operating with a $B_0$ field of less than or equal to approximately 0.2 T, though systems having a $B_0$ field of between 0.2 T and approximately 0.3 T have sometimes been characterized as low-field as a consequence of increased field strengths at the high end of the high-field regime. Within the low-field regime, low-field MRI systems operating with a $B_0$ field of less than 0.1 T are referred to herein as "very low-field" and low-field MRI systems operating with a $B_0$ field of less than 10 mT are referred to herein as "ultra-low field."

FIG. 1 illustrates exemplary components of a magnetic resonance imaging (MRI) system, in accordance with some embodiments. In the illustrative example of FIG. 1, MRI system 100 comprises computing device 104, controller 106, pulse sequences repository 108, power management system 110, and magnetics components 120. It should be appreciated that system 100 is illustrative and that an MRI system may have one or more other components of any suitable type in addition to or instead of the components illustrated in FIG. 1. However, an MRI system will generally include these high-level components, though the implementation of these components for a particular MRI system may differ. It may be appreciated that the techniques described herein for eddy current compensation may be used with any suitable type of MRI systems including high-field MRI systems, low-field MRI systems, and ultra-low field MRI systems. For example, the techniques described herein may be used with any of the MRI systems described herein and/or as described in U.S. Pat. No. 10,627,464 filed Jun. 30, 2017 and titled "Low-Field Magnetic Resonance Imaging Methods and Apparatus," which is incorporated by reference herein in its entirety.

As illustrated in FIG. 1, magnetics components 120 comprise $B_0$ magnets 122, shim coils 124, radio frequency (RF) transmit and receive coils 126, and gradient coils 128. $B_0$ magnets 122 may be used to generate the main magnetic field $B_0$. $B_0$ magnets 122 may be any suitable type or combination of magnetics components that can generate a desired main magnetic $B_0$ field. In some embodiments, $B_0$ magnets 122 may be a permanent magnet, an electromagnet, a superconducting magnet, or a hybrid magnet comprising one or more permanent magnets and one or more electromagnets and/or one or more superconducting magnets. In some embodiments, $B_0$ magnets 122 may be configured to generate a $B_0$ magnetic field having a field strength that is less than or equal to 0.2 T or within a range from 50 mT to 0.1 T.

For example, in some embodiments, $B_0$ magnets 122 may include a first and second $B_0$ magnet, each of the first and second $B_0$ magnet including permanent magnet blocks arranged in concentric rings about a common center. The first and second $B_0$ magnet may be arranged in a bi-planar configuration such that the imaging region is located between the first and second $B_0$ magnets. In some embodiments, the first and second $B_0$ magnets may each be coupled to and supported by a ferromagnetic yoke configured to capture and direct magnetic flux from the first and second $B_0$ magnets. Additional details of such embodiments are described in U.S. Pat. No. 10,545,207 titled "Low-Field magnetic Resonance Imaging Methods and Apparatus" filed on Apr. 18, 2018, which is incorporated by reference herein in its entirety.

Gradient coils 128 may be arranged to provide gradient fields and, for example, may be arranged to generate gradients in the $B_0$ field in three substantially orthogonal directions (X, Y, Z). Gradient coils 128 may be configured to encode emitted MR signals by systematically varying the $B_0$ field (the $B_0$ field generated by $B_0$ magnets 122 and/or shim coils 124) to encode the spatial location of received MR signals as a function of frequency or phase. For example, gradient coils 128 may be configured to vary frequency or phase as a linear function of spatial location along a particular direction, although more complex spatial encoding profiles may also be provided by using nonlinear gradient coils. In some embodiments, gradient coils 128 may be implemented using laminate panels (e.g., printed circuit boards). Examples of such gradient coils are described in U.S. Pat. No. 9,817,093 titled "Low Field Magnetic Resonance Imaging Methods and Apparatus" filed on Sep. 4, 2015, which is incorporated by reference herein in its entirety.

MRI is performed by exciting and detecting emitted MR signals using transmit and receive coils, respectively (often referred to as radio frequency (RF) coils). Transmit/receive coils may include separate coils for transmitting and receiving, multiple coils for transmitting and/or receiving, or the same coils for transmitting and receiving. Thus, a transmit/receive component may include one or more coils for transmitting, one or more coils for receiving and/or one or more coils for transmitting and receiving. Transmit/receive coils are also often referred to as Tx/Rx or Tx/Rx coils to generically refer to the various configurations for the transmit and receive magnetics component of an MRI system. These terms are used interchangeably herein. In FIG. 1, RF transmit and receive circuitry 116 comprises one or more transmit coils that may be used to generate RF pulses to induce an oscillating magnetic field $B_1$. The transmit coil(s) may be configured to generate any suitable types of RF pulses. The transmit and receive circuitry 116 may include additional electronic components of the transmit and receive chains, as described in U.S. Patent Application Publication No. 2019/0353723 titled "Radio-Frequency Coil Signal Chain for a Low-Field MRI System" and filed on May 21, 2019, which is hereby incorporated by reference in its entirety.

Power management system 110 includes electronics to provide operating power to one or more components of the low-field MRI system 100. For example, power management system 110 may include one or more power supplies, energy storage devices, gradient power components, transmit coil components, and/or any other suitable power electronics needed to provide suitable operating power to energize and operate components of MRI system 100. As illustrated in FIG. 1, power management system 110 comprises power supply system 112, power component(s) 114, transmit/receive switch 116, and thermal management components 118 (e.g., cryogenic cooling equipment for superconducting magnets, water cooling equipment for electromagnets).

Power supply system 112 includes electronics to provide operating power to magnetic components 120 of the MRI system 100. The electronics of power supply system 112 may provide, for example, operating power to one or more gradient coils (e.g., gradient coils 128) to generate one or more gradient magnetic fields to provide spatial encoding of the MR signals. Additionally, the electronics of power supply system 112 may provide operating power to one or more RF coils (e.g., RF transmit and receive coils 126) to generate and/or receive one or more RF signals from the subject. For example, power supply system 112 may include a power supply configured to provide power from mains electricity to the MRI system and/or an energy storage device. The power supply may, in some embodiments, be an AC-to-DC power supply configured to convert AC power from mains electricity into DC power for use by the MRI system. The energy storage device may, in some embodiments, be any one of a battery, a capacitor, an ultracapacitor, a flywheel, or any other suitable energy storage apparatus that may bidirectionally receive (e.g., store) power from mains electricity and supply power to the MRI system. Additionally, power supply system 112 may include additional power electronics encompassing components including, but not limited to, power converters, switches, buses, drivers, and any other suitable electronics for supplying the MRI system with power.

Amplifiers(s) 114 may include one or more RF receive (Rx) pre-amplifiers that amplify MR signals detected by one or more RF receive coils (e.g., coils 126), one or more RF transmit (Tx) power components configured to provide power to one or more RF transmit coils (e.g., coils 126), one or more gradient power components configured to provide power to one or more gradient coils (e.g., gradient coils 128), and one or more shim power components configured to provide power to one or more shim coils (e.g., shim coils 124). Transmit/receive switch 116 may be used to select whether RF transmit coils or RF receive coils are being operated.

As illustrated in FIG. 1, MRI system 100 includes controller 106 (also referred to as a console) having control electronics to send instructions to and receive information from power management system 110. Controller 106 may be configured to implement one or more pulse sequences, which are used to determine the instructions sent to power management system 110 to operate the magnetic components 120 in a desired sequence (e.g., parameters for operating the RF transmit and receive coils 126, parameters for operating gradient coils 128, etc.). As illustrated in FIG. 1, controller 106 also interacts with computing device 104 programmed to process received MR data. For example, computing device 104 may process received MR data to generate one or more MR images using any suitable image reconstruction process(es). Controller 106 may provide information about one or more pulse sequences to computing device 104 for the processing of data by the computing device. For example, controller 106 may provide information about one or more pulse sequences to computing device 104 and the computing device may perform an image reconstruction process based, at least in part, on the provided information.

Computing device 104 may be any electronic device configured to process acquired MR data and generate one or more images of a subject being imaged. In some embodiments, computing device 104 may be located in a same room as the MRI system 100 and/or coupled to the MRI system 100. In some embodiments, computing device 104 may be a fixed electronic device such as a desktop computer, a server, a rack-mounted computer, or any other suitable fixed electronic device that may be configured to process MR data and generate one or more images of the subject being imaged. Alternatively, computing device 104 may be a portable device such as a smart phone, a personal digital assistant, a laptop computer, a tablet computer, or any other portable device that may be configured to process MR data and generate one or images of the subject being imaged. In some embodiments, computing device 104 may comprise multiple computing devices of any suitable type, as aspects of the disclosure provided herein are not limited in this respect.

Figure 2:
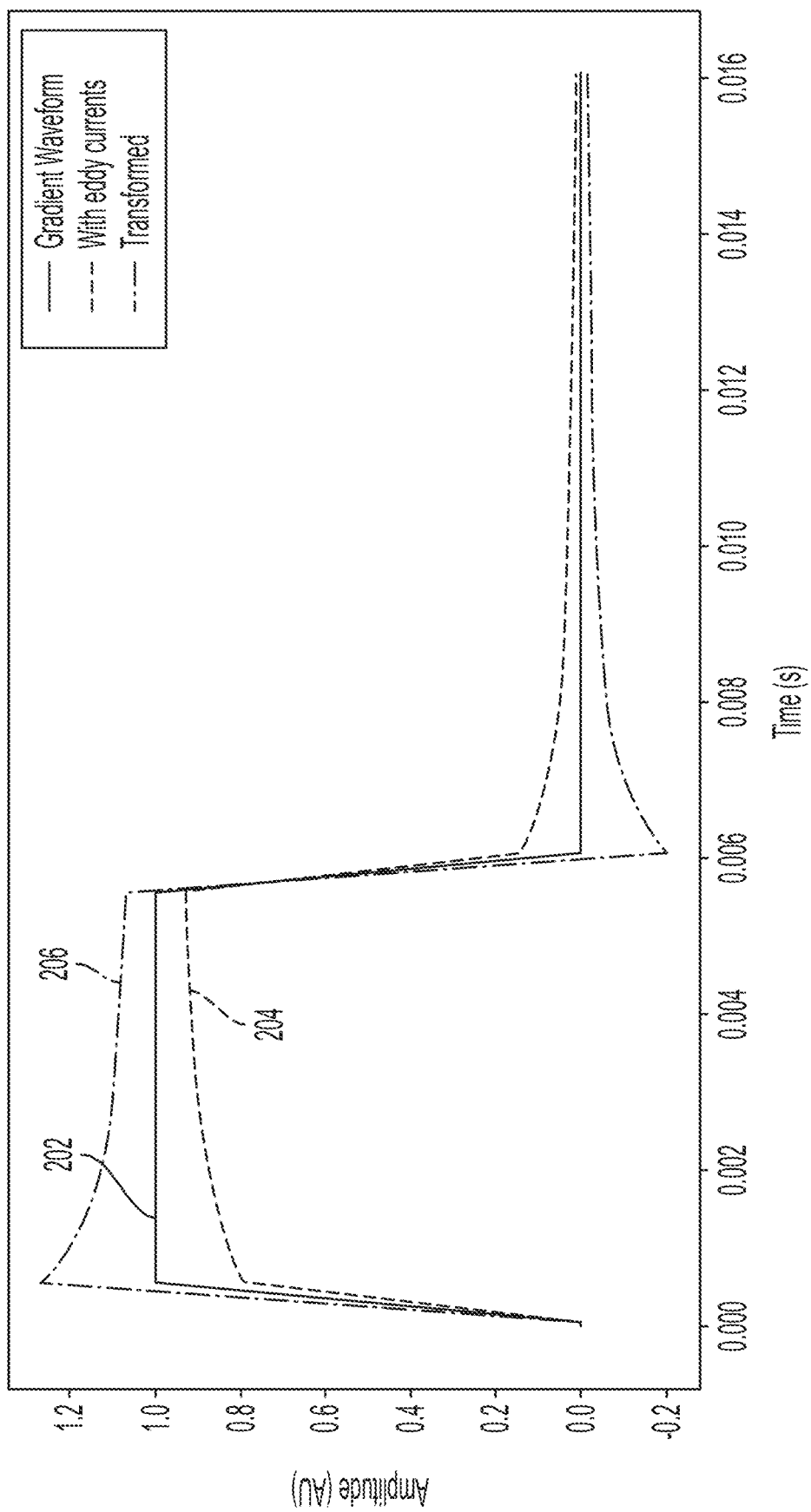
FIG. 2 illustrates an exemplary gradient waveform, the effects of eddy currents on the gradient waveform when generated by a gradient coil during a pulse sequence, and a gradient waveform corrected using a nonlinear function of a characteristic of the gradient waveform, in accordance with some embodiments of the technology described herein.

FIG. 2 illustrates an exemplary gradient waveform 202, the uncompensated gradient waveform 204 generated using the gradient waveform 202 when no eddy current correction is performed, and a transformed gradient waveform 206 corrected using a nonlinear function of a characteristic of the gradient waveform, in accordance with some embodiments. The gradient waveform 202 is a representation of a gradient field pulse that could be produced by a gradient coil of an MRI system during MR image acquisition. The representation may be digital or analog. The uncompensated gradient waveform 204 is a representation of the gradient field produced by a gradient coil based on the gradient waveform 202 with no eddy current corrections applied. The uncompensated gradient waveform 204 shows the effects of eddy currents in the MRI system on the actual gradient field produced by the gradient coils. In particular, the maximum amplitude of the gradient waveform 202 is never reached by uncompensated gradient waveform 204, and there is a rise time and a fall time associated with the gradient field pulse of uncompensated gradient waveform 204.

Transformed gradient waveform 206 shows the effects of an illustrative nonlinear correction applied to the gradient waveform 202, in accordance with some embodiments. The nonlinear correction, when applied to the gradient waveform 202, is configured to compensate for the effects of eddy currents as shown in the uncompensated gradient waveform 204 so that when the transformed gradient waveform 206 is transmitted to the gradient coil, the gradient coil generates a gradient field that more closely approximates the gradient waveform 202 (e.g., the "target gradient field") than the uncompensated gradient waveform 204.

In some embodiments, the transformed gradient waveform 206 may be generated by using a nonlinear function of a characteristic of the gradient waveform 202. For example, the nonlinear function may be dependent on the amplitude of the gradient waveform, the direction of the gradient waveform (e.g., whether the gradient waveform is configured to generate positive or negative magnetic fields), the shape of the gradient waveform (e.g., trapezoidal, rectangular, Gaussian, and/or sinusoidal), or the slew rate of the gradient waveform. The nonlinear function may be determined using eddy current calibration data obtained from the MRI system. For example, a field probe may be used to obtain eddy current calibration data as a function of the gradient field amplitude. Additional aspects of such a field probe are described in U.S. Patent Application Publication No. 2020/0209334, titled "Correcting for Hysteresis in Magnetic Resonance Imaging" and filed on Nov. 15, 2019, which is hereby incorporated herein in its entirety.

Figure 3A:
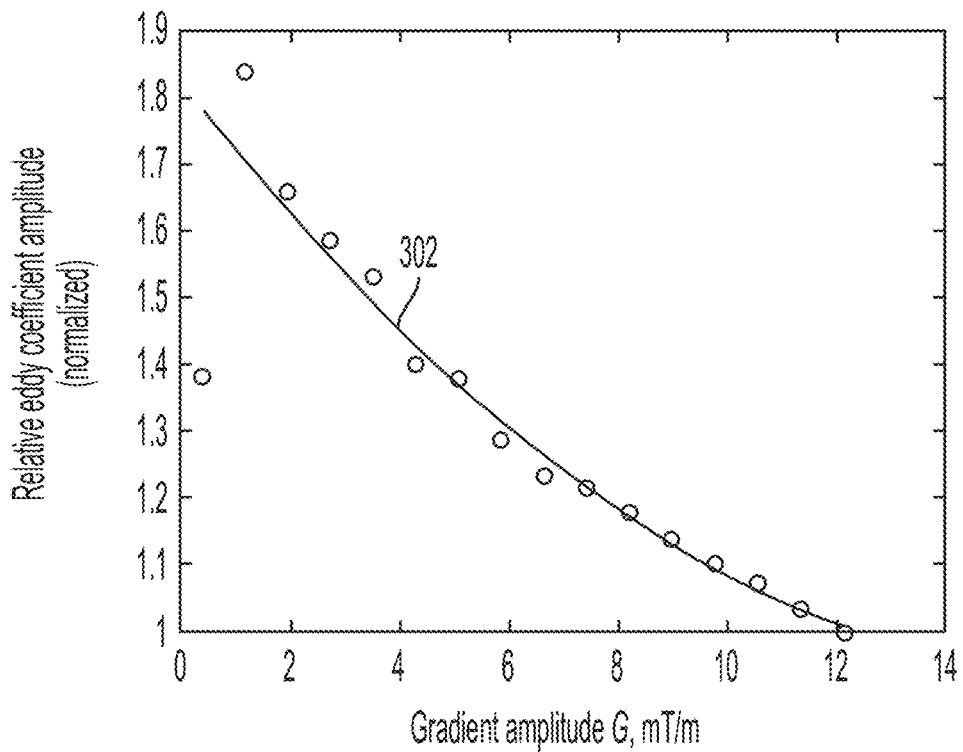
FIGS. 3A and 3B illustrate exemplary nonlinear functions of gradient field amplitudes, in accordance with some embodiments of the technology described herein.
Figure 3B:
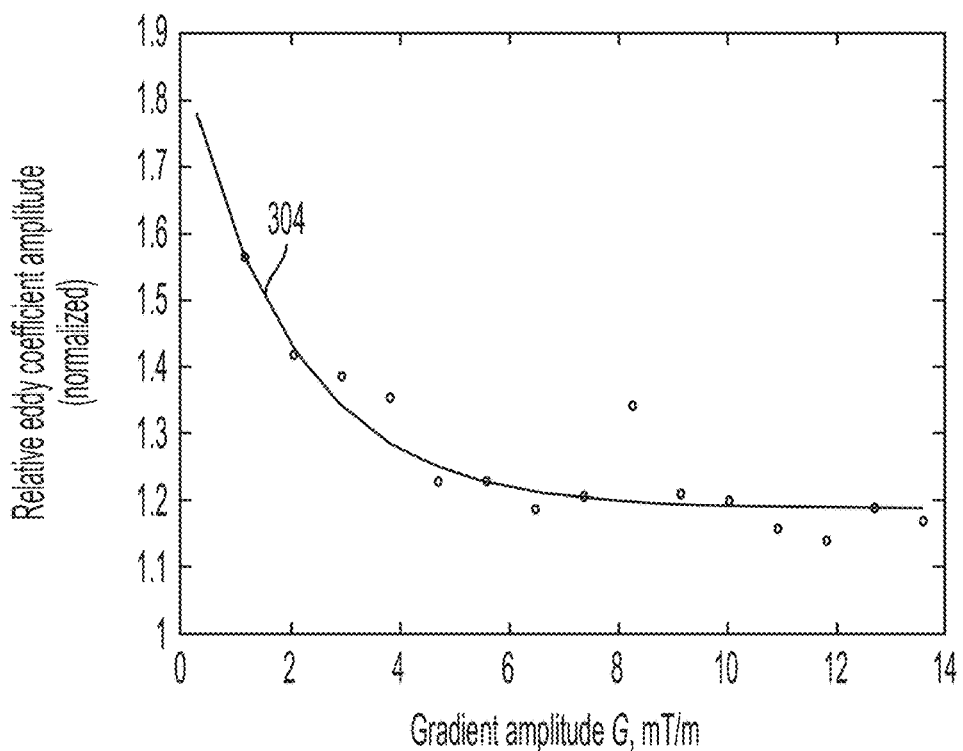

FIGS. 3A and 3B illustrate exemplary nonlinear functions of gradient waveform amplitudes based on eddy current calibration data, in accordance with some embodiments. However, aspects of the technology described herein are not so limited, and it may be appreciated that the nonlinear functions may be functions of other characteristics of a gradient waveform (e.g., slew rate, shape, direction of a target gradient field) in addition to or instead of the gradient waveform amplitude.

The eddy current calibration data was obtained using a field probe to measure eddy current coefficient amplitudes as a function of applied gradient field amplitudes within the MRI system. The eddy current calibration data was obtained by having the MRI system generate a gradient field, having the MRI system stop generating the gradient field, and measuring the eddy current amplitudes after a time delay after the MRI system has stopped generating the gradient field. By varying the gradient field amplitudes, data may be obtained that describes a relationship between the eddy current amplitude and the applied gradient field amplitudes. By varying the time delay, behavior of different eddy current components may be captured.

The eddy current calibration data may then be used to estimate a nonlinear relationship between the eddy current amplitude and the gradient field amplitude, in some embodiments. This estimate yields a nonlinear function for use in correcting the gradient waveform. Before performing this estimation, a functional form of the nonlinear function may be chosen (e.g., choosing one of a polynomial function, piece-wise polynomial function, exponential function, etc.). Thereafter, the coefficients of the selected model may be estimated using the eddy current calibration data. The estimation could be done in any suitable way including least squares estimation, maximum likelihood estimation, nonlinear least squares, optimization, and/or any other suitable parameter estimation technique, as aspects of the technology described herein are not limited in this respect.

The process of obtaining the eddy current calibration data included having the MRI system generate gradient fields of varying field strengths, setting a time delay, and measuring the eddy current effects after the time delay for each gradient field of a different field strength.

FIG. 3A shows a second-order polynomial function fit to the eddy current calibration data, in accordance with the following equation:

$$C_n(G) = P_0 + P_1 G + P_2 G^2$$

where $P_0$, $P_1$, and $P_2$ are coefficients describing the nonlinear function and G is the applied gradient field amplitude in mT/m. FIG. 3B shows an exponential function described by:

$$C_n(G) = P_0 + P_1 e^{-\frac{G}{P_2}}.$$

It may be appreciated that while the examples of FIGS. 3A and 3B show a decreasing correlation between the eddy current amplitude and the applied gradient field amplitude, the opposite correlation may also be true (e.g., where the correlation may increase with the characteristic of the gradient waveform). It may also be appreciated that the examples of FIGS. 3A and 3B are non-limiting in nature, and that any arbitrary function may be fit to the eddy current calibration data. Additional examples of such functions include piecewise polynomial functions, polynomial functions of a higher order, separate functions determined for positive and negative gradient field directions, sigmoid functions, or any suitable, arbitrary function.

Each function C(G), as shown in FIGS. 3A and 3B, shows data for different eddy current components related to a time constant of the eddy current dissipation. By changing the time delay between gradient field generation and eddy current data measurement, different eddy current components can be measured. Each eddy current coefficient term n may be associated with an individual time constant. The gradient field impulse response is described by the following equation:

$$R(t) = \sum_{n=1}^{N} C_n(G) e^{-w_n t}$$

where $w_n$ is a time constant related to a dissipation rate of the eddy currents. Each $C_n(G)$ function may be determined to account for different eddy currents with differing dissipation rates within the MRI system. For example, eddy currents induced in thin laminate conductors may dissipate quickly, while eddy currents induced in larger ferromagnetic components (e.g., the yoke and/or permanent magnet components of the $B_0$ magnets) may dissipate more slowly and be longer-lived.

The use of the above-described functions to compensate a gradient waveform for eddy current effects is described in further detail in connection with FIGS. 4A-4F. This compensation may be executed using any suitable computing device. For example, in some embodiments, the compensation may be performed by a computing device co-located (e.g., in the same room) with an MRI system. As another example, in some embodiments, the compensation may be performed by one or more processors located on the MRI system. Alternately, in some embodiments, the compensation may be performed by one or more processors located remotely from the MRI system (e.g., as part of a cloud computing environment).

Figure 4A:
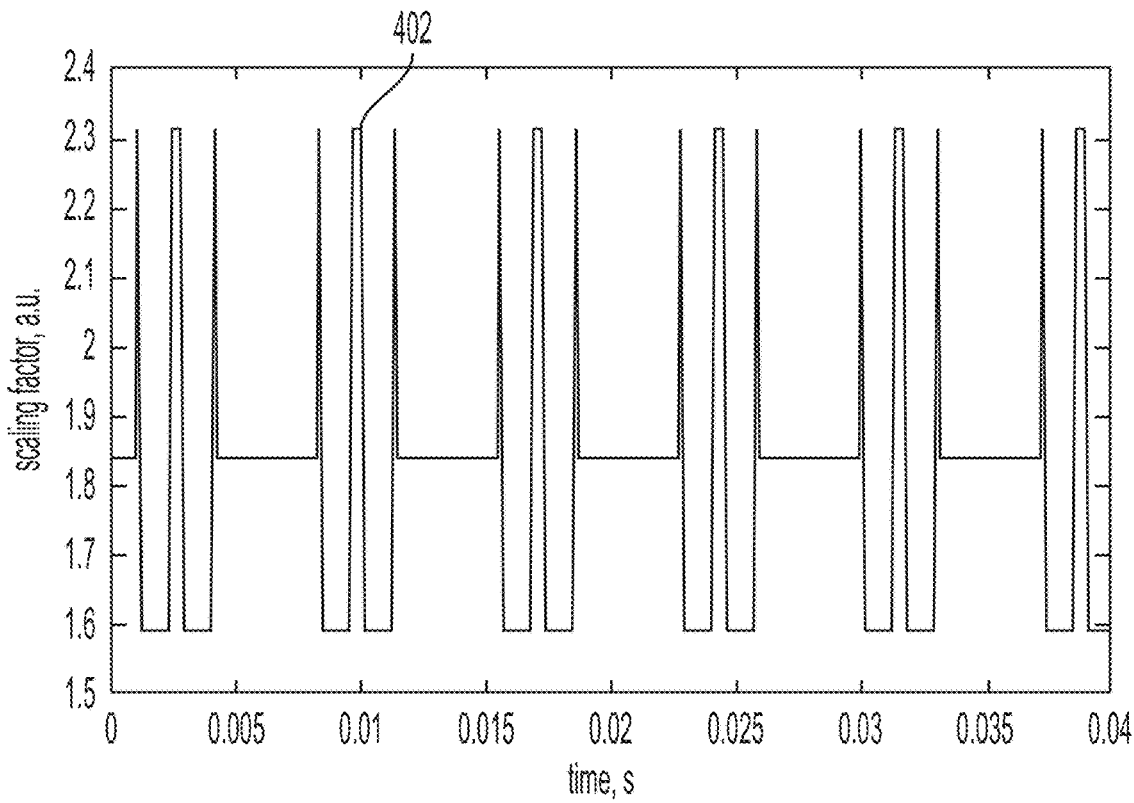
FIG. 4A illustrates a waveform obtained by applying an exemplary nonlinear function to a gradient waveform, in accordance with some embodiments of the technology described herein.

FIG. 4A illustrates a waveform 402 obtained by applying an exemplary nonlinear function to a gradient waveform, in accordance with some embodiments. The particular nonlinear function applied in the example of FIG. 4A is $$C_n(G,t) = 0.6 + 1.7 e^{-G(t)/12}$$

which was determined based on eddy current calibration data obtained from the MRI system, as described above. The waveform 402 was generated by providing a gradient waveform G(t) as input to the nonlinear function $C_n(G,t)$. The waveform 402 describes a nonlinear scaling factor that represents the effects of eddy currents on the gradient waveform.

Figure 4B:
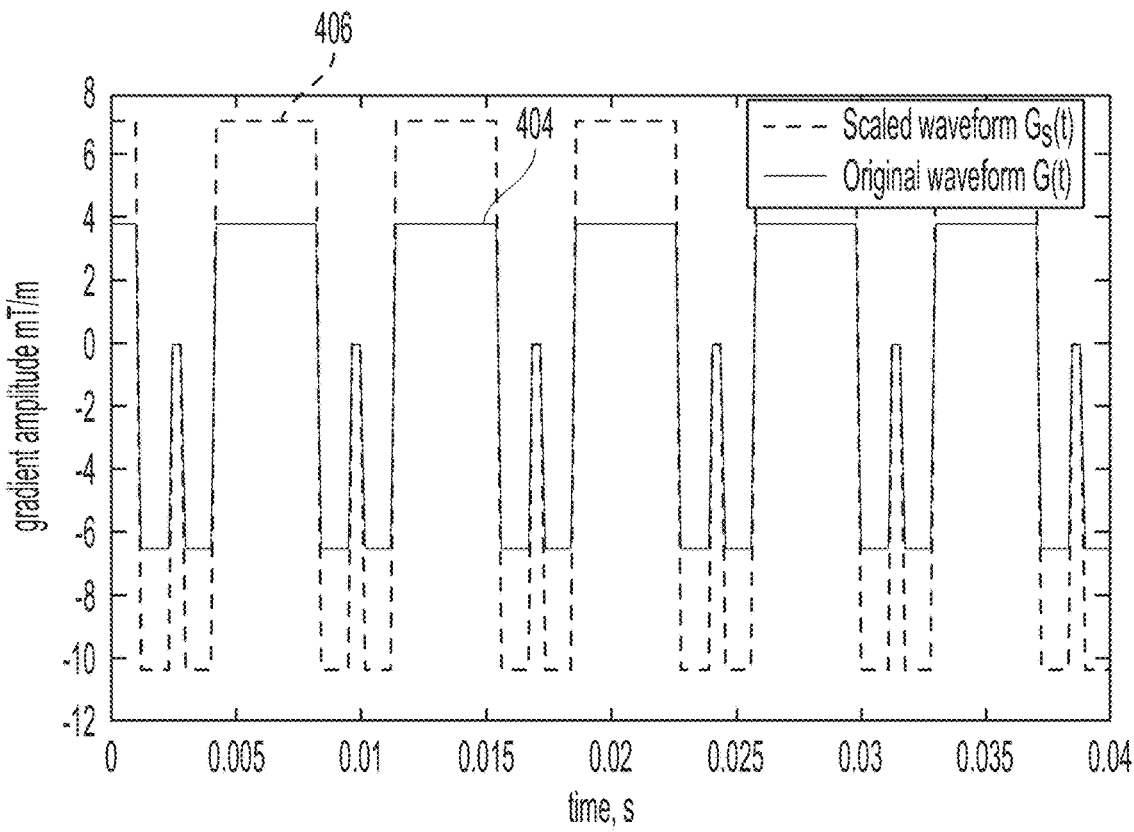
FIG. 4B illustrates a gradient waveform and a scaled gradient waveform obtained by scaling the gradient waveform using the non-linear function shown in FIG. 4A, in accordance with some embodiments of the technology described herein.

FIG. 4B illustrates the original gradient waveform 404 and a scaled gradient waveform 406 obtained using the waveform 402, in accordance with some embodiments. To obtain the scaled gradient waveform 406, the nonlinear function $C_n(G,t)$ may be applied to the original gradient waveform 404 (G(t)) according to:

$$G_s(t) = G(t) \times C_n(G,t)$$

where $G_s(t)$ is the scaled gradient waveform 406. As can be seen in the example of FIG. 4B, the application of the nonlinear function $C_n(G,t)$ emphasizes regions of greater gradient field amplitude and regions of change in gradient field amplitude.

Figure 4C:
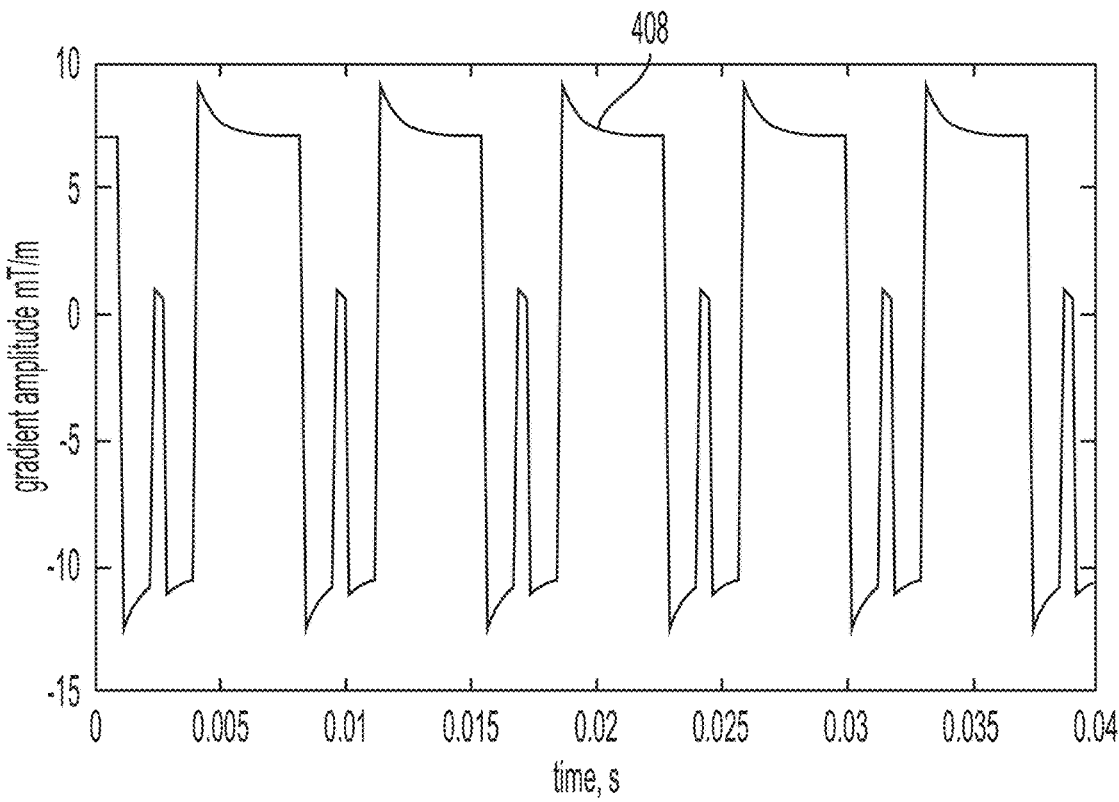
FIG. 4C illustrates a transformed gradient waveform obtained by applying a filter to the scaled gradient waveform of FIG. 4B, in accordance with some embodiments of the technology described herein.

FIG. 4C illustrates the transformed gradient waveform 408 obtained by applying a transformation to the scaled gradient waveform 406 of FIG. 4B, in accordance with some embodiments. The transformation may be used to pre-emphasize the scaled gradient waveform 406 by applying a pre-emphasis filter to the scaled gradient transformation 406.

In some embodiments, the transformation (e.g., the pre-emphasis filter) may be estimated from eddy current calibration data. For example, the gradient field impulse response h[n] may be modeled as a sum of multiple exponential functions and the weights and decay rates of each of the exponentials in the sum may be estimated using the eddy current calibration data. The estimated parameters of the gradient field impulse response may be used to determine a corresponding transfer function H(s), and the inverse (1/H(s)) of the transfer function H(s) may be used to obtain (e.g., by applying an inverse Laplace transform) the transformation (e.g., pre-emphasis filter) to be applied to the scaled gradient waveform.

For example, in some embodiments, the gradient field impulse response h[n] may be a sum of two exponential functions, such that its transfer function is given according to:

$$H(s) = 1 - \frac{(c_1 w_2 + c_2 w_1)s + (c_1 + c_2)}{s^2 + (w_1 + w_2)s + w_1 w_2}.$$

In this case, an inverse Laplace transform of 1/H(s) may be used to obtain a pre-emphasis filter that is applied to the scaled gradient waveform.

In some embodiments, the transformation may be applied to the scaled gradient waveform in the time domain. For example, the pre-emphasis filter may be convolved with the scaled gradient waveform 406 to obtain the transformed gradient waveform 408. It should be appreciated that the transformation may be applied in other suitable domain (e.g., in the frequency domain after a suitable Fourier transformation, for example via a fast Fourier transform), as aspects of the technology described herein are not limited in this respect.

Figure 4D:
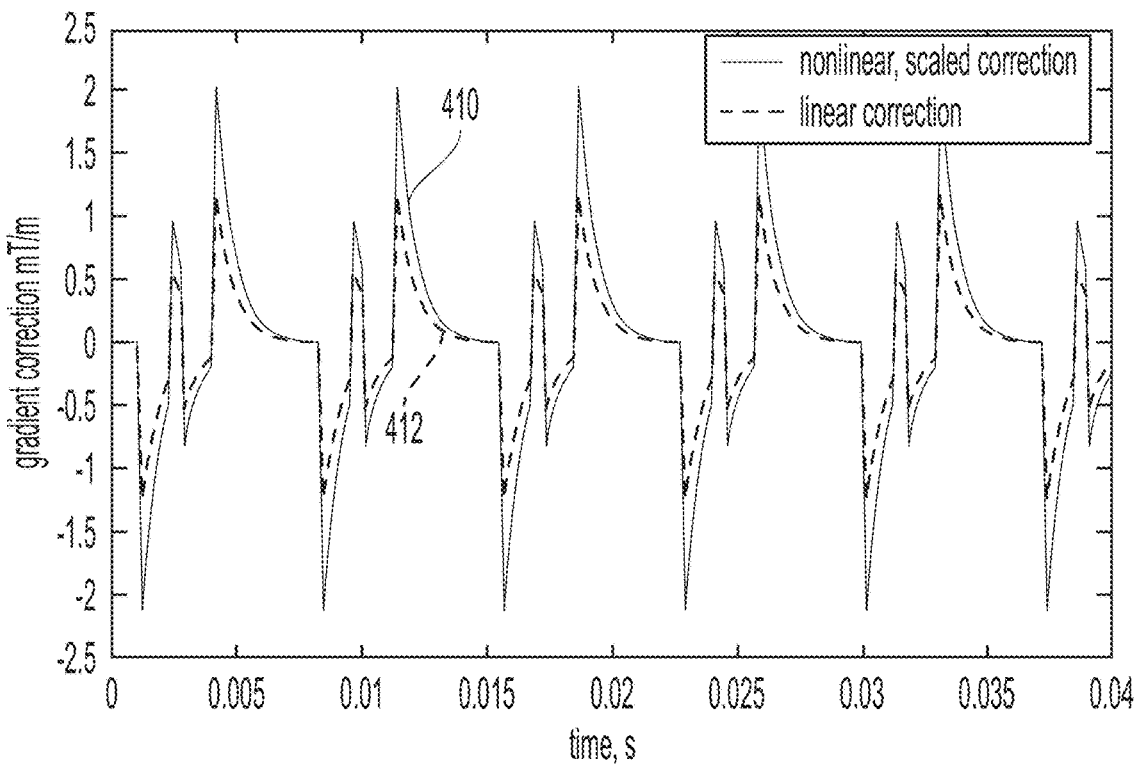
FIG. 4D illustrates a correction waveform obtained from the transformed gradient waveform, in accordance with some embodiments of the technology described herein, and an illustrative correction gradient waveform obtained using a conventional linear correction.

FIG. 4D illustrates a correction waveform 410 obtained from the transformed gradient waveform 408, in accordance with some embodiments, and an illustrative correction gradient waveform 412 obtained using a linear correction. The correction waveform 410 may be obtained by, for example, subtracting the scaled gradient waveform 406 from the transformed gradient waveform 408:

$$G_c(t) = G_t(t) - G_s(t).$$

In the example of FIG. 4D, the correction waveform 410 shows additional compensation for changes in gradient waveform amplitude than the correction gradient waveform 412 obtained using a linear correction (e.g., where $C_n(G,t)$ is a linear function).

Figure 4E:
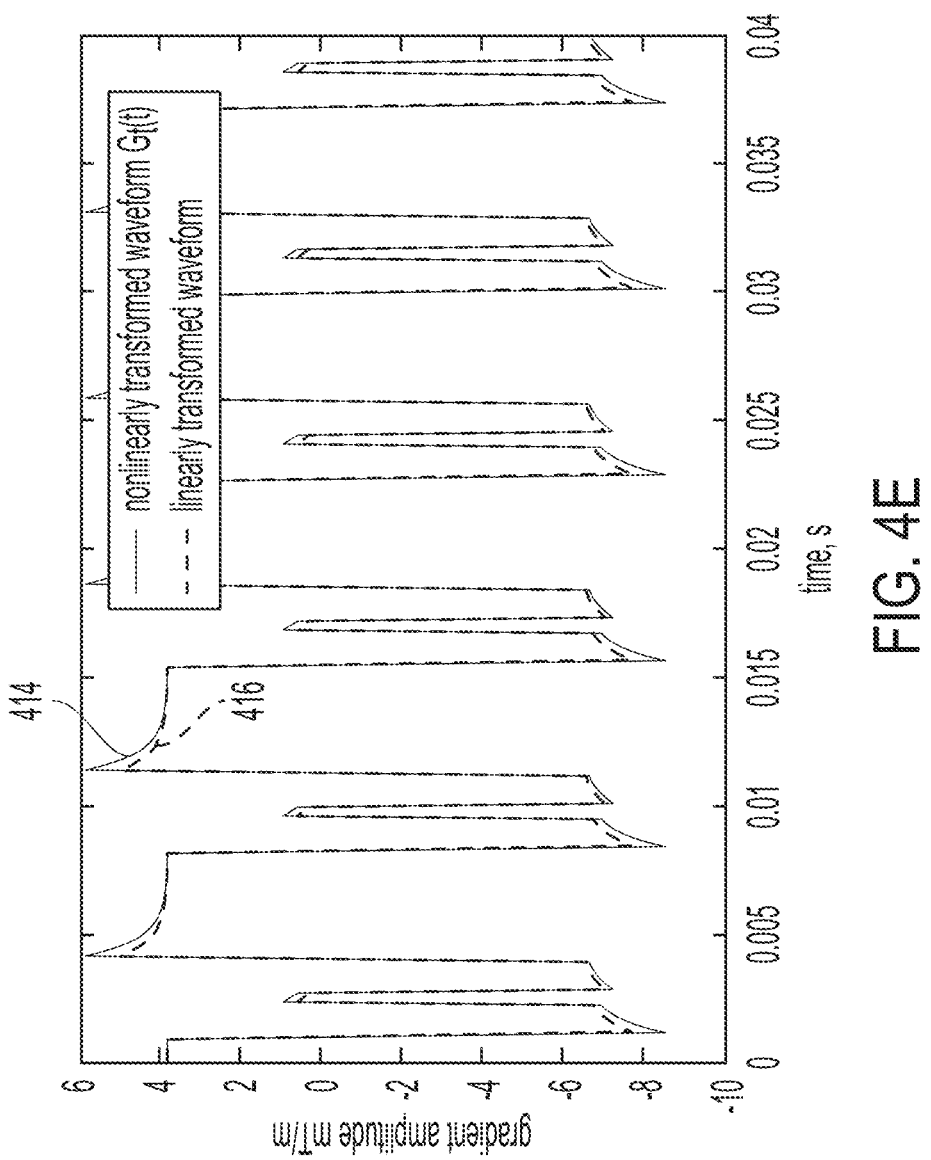
FIG. 4E illustrates a corrected gradient waveform obtained using the correction gradient waveform of FIG. 4D and the gradient waveform of FIG. 4B, in accordance with some embodiments of the technology described herein, and an illustrative corrected gradient waveform corrected using a conventional linear correction.

The correction waveform 410 may then be used to correct the gradient waveform 404 for eddy current effects. FIG. 4E illustrates a corrected gradient waveform 414 obtained using the correction waveform 410, in accordance with some embodiments, and an illustrative corrected gradient waveform 416 corrected using the correction gradient waveform 412 obtained using a linear correction. The correction waveform 410 may be applied to the gradient waveform 404 by, for example, combining the two waveforms. In some embodiments, the correction waveform 410 may be added to the gradient waveform 404 to obtain the corrected gradient waveform 414:

$$G_{corr}(t) = G(t) + G_c(t).$$

In the example of FIG. 4E, the corrected gradient waveform 412 obtained using a linear correction exhibits a lower amplitude and reduced compensation for changes the amplitude of the gradient waveform than the corrected gradient waveform 414 obtained using a nonlinear correction.

It may be appreciated that the examples of FIGS. 4A-4E were performed for a single component of the eddy currents. However, the technique can be extended to multiple eddy current components. The steps of FIGS. 4A-4D may be implemented for each component, n, individually using each nonlinear function $C_n(G,t)$ to obtain multiple correction waveforms, $G_c(t)$. The corrected gradient waveform may then be obtained by combining the gradient waveform G(t) with the multiple correction waveforms, $G_c(t)$. For example, the corrected gradient waveform may be obtained by summing the gradient waveform with the multiple correction waveforms:

$$G_{corr}(t) = G(t) + \sum_n G_c(t)$$

Figure 4F:
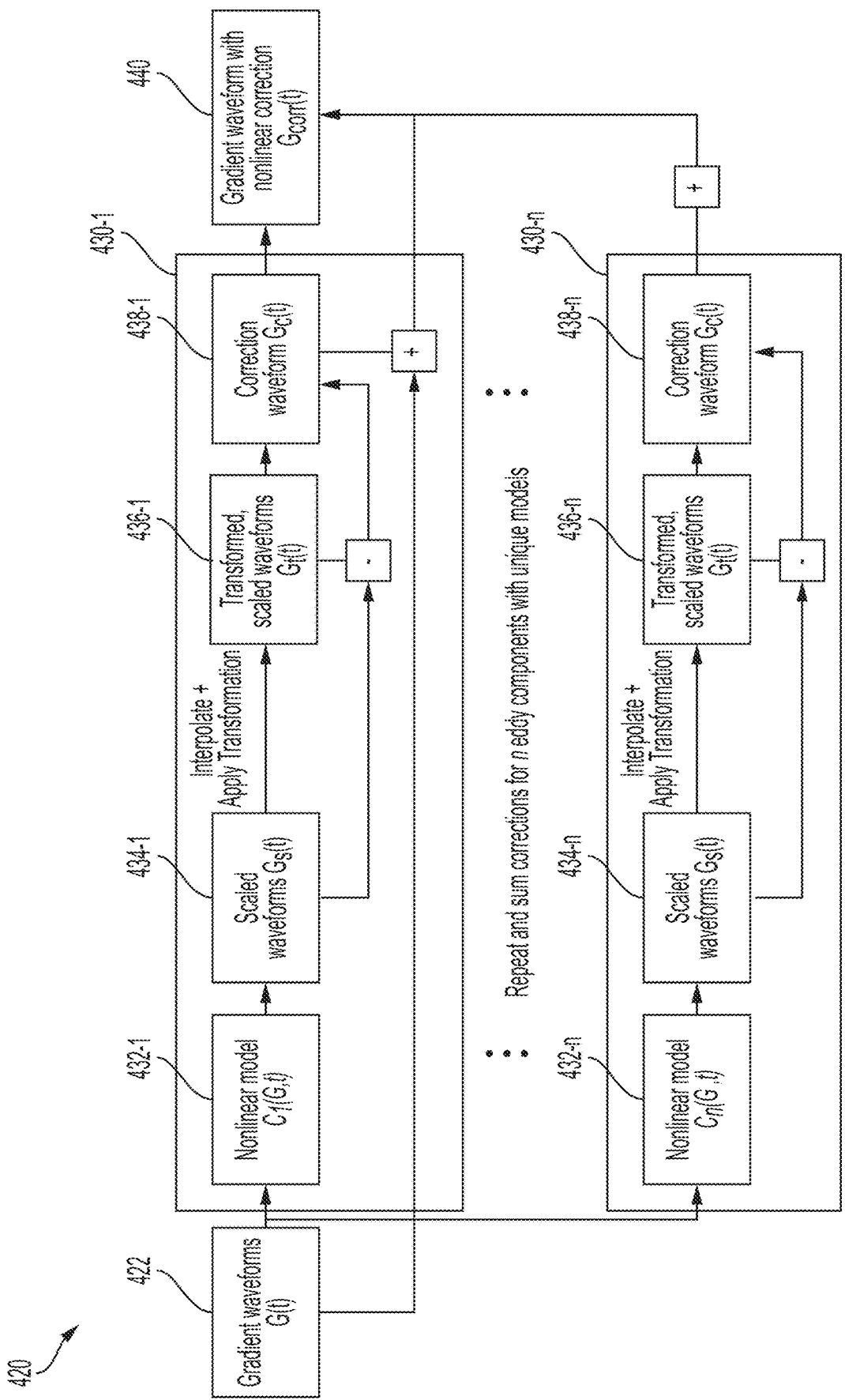
FIG. 4F illustrates a block diagram of a process 420 for correcting a gradient waveform, in accordance with some embodiments of the technology described herein.

FIG. 4F illustrates a block diagram of a process 420 for correcting a gradient waveform, in accordance with some embodiments. The process 420 outlines the steps described in the examples of FIGS. 4A-4E. As described above, process 420 may be executed using any suitable computing device.

Process 420 begins at block 422, where gradient waveforms G(t) are selected and/or accessed by the computing device. For example, the gradient waveforms may be selected by a user or in response to input from a user (e.g., indicating a body part of the subject to be imaged, indicating types of information to be acquired during the MR image acquisition). The gradient waveforms may be accessed from a pulse sequence repository (e.g., as stored on a computer readable medium such as, for example, pulse sequence repository 108 of FIG. 1).

The gradient waveforms G(t) may be used in multiple correction processes 430-1 through 430-n, in some embodiments. The correction processes 430-1 through 430-n may be implemented for each eddy current component, n. First, at block 432-1 a nonlinear function $C_1(G,t)$ may be determined based on eddy current calibration data (e.g., by performing an appropriate fitting process) and/or accessed from storage (e.g., stored on a computer readable medium, either locally or remotely). The nonlinear function $C_1(G,t)$ may then, at block 434-1, be used to generate scaled gradient waveforms $G_s(t)$ by applying the nonlinear function $C_1(G,t)$ to the gradient waveforms G(t). For example, the nonlinear function $C_1(G,t)$ may be multiplied by the gradient waveforms G(t) to generate scaled gradient waveforms $G_s(t)$.

In some embodiments, at block 436-1, a transformation may be applied to the scaled gradient waveforms $G_s(t)$ to obtain transformed gradient waveforms $G_t(t)$. The transformation may be applied to the scaled gradient waveforms $G_s(t)$ by filtering the scaled gradient waveforms $G_s(t)$. In some embodiments, the transformation may be determined based on the eddy current calibration data. For example, the transformation may be determined by applying an inverse Laplace transformation to an impulse response function determined based on the eddy current calibration data.

In some embodiments, at block 438-1, a correction waveform $G_c(t)$ may be obtained by subtracting the scaled gradient waveforms $G_s(t)$ from the transformed gradient waveforms $G_t(t)$. Such a subtraction leaves only the eddy current correction that is to be applied to the gradient waveforms G(t). In some embodiments, the acts described in connection with process 430-1 may be repeated for each nonlinear function $C_n(G,t)$ in process 430-n such that n correction waveforms $G_c(t)$ may be generated. To correct the gradient waveform G(t) and obtain the corrected gradient waveform $G_{corr}(t)$ at block 440, the n correction waveforms $G_c(t)$ may be summed and combined with the gradient waveform G(t). For example, the summed n correction waveforms $G_c(t)$ may be added to the gradient waveform G(t), in some embodiments.

Figure 5:
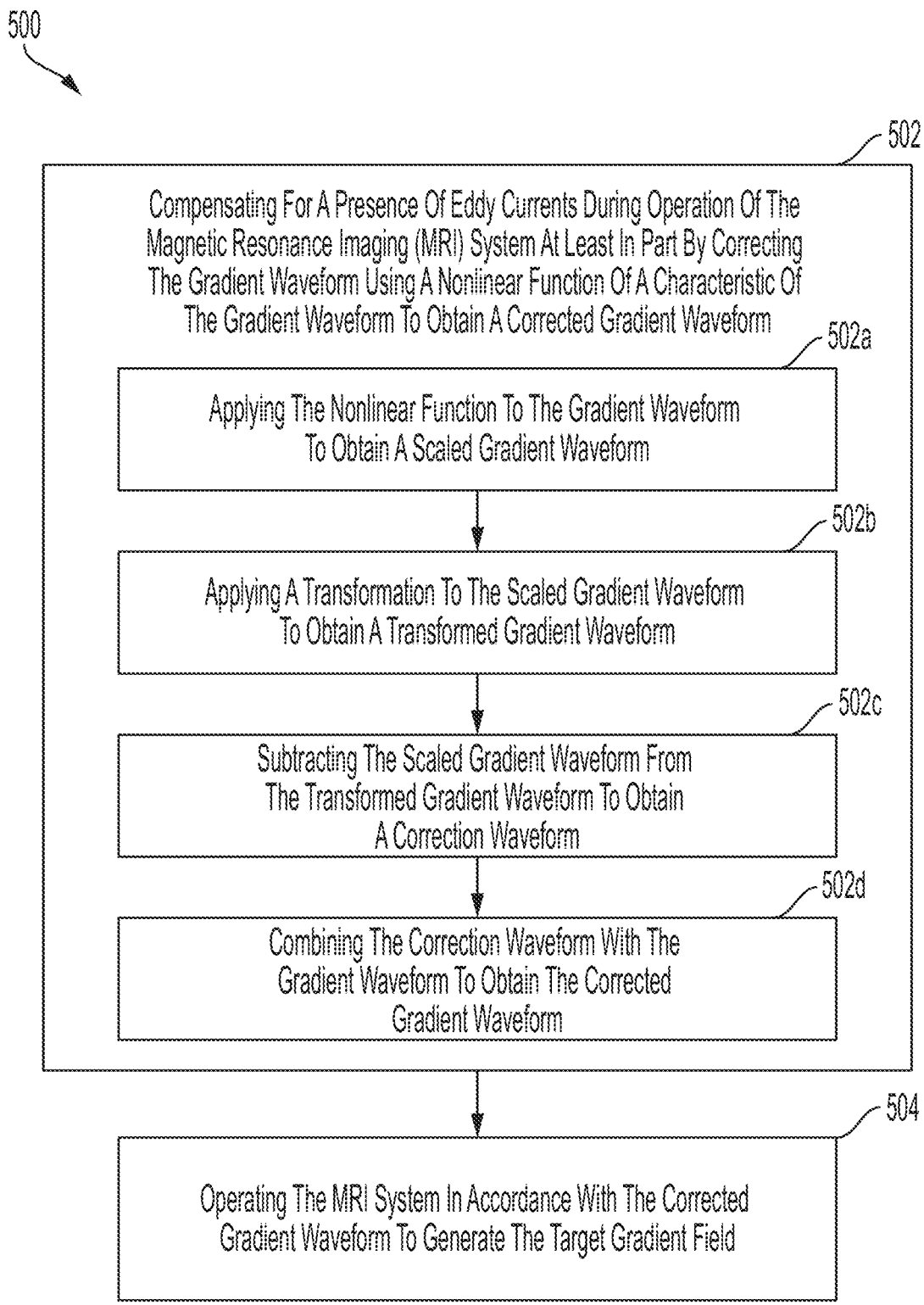
FIG. 5 is a flowchart of a process 500 for correcting a gradient waveform, in accordance with some embodiments of the technology described herein.

FIG. 5 is a flowchart of a process 500 for correcting a gradient waveform, in accordance with some embodiments. Process 500 may be executed using any suitable computing device. For example, in some embodiments, process 500 may be performed by a computing device co-located (e.g., in the same room) with an MRI system. As another example, in some embodiments, process 500 may be performed by one or more processors located on the MRI system. Alternately, in some embodiments, process 500 may be performed by one or more processors located remotely from the MRI system (e.g., as part of a cloud computing environment).

Process 500 may begin at act 502, where eddy currents are compensated for during operation of the MRI system. The compensation may be performed by the computing device at least in part by correcting the gradient waveform using a nonlinear function of a characteristic of the gradient waveform to obtain a corrected gradient waveform. The corrected gradient waveform, when used by the MRI system, may be associated with a target gradient field generated by the MRI system.

In some embodiments, the nonlinear function of a characteristic of the gradient waveform may be any suitable nonlinear function, as described in connection with FIGS. 3A-4F. The nonlinear function may be determined based on eddy current calibration data obtained from the MRI system. For example, the nonlinear function may be one of the functions $C_n(G)$, which may be obtained by performing a nonlinear fit to eddy current calibration data relating the eddy current amplitude to the gradient field amplitude (e.g., as obtained by a field probe).

In some embodiments, act 502 may include several sub-acts, though it is to be appreciated that any combination of sub-acts may be included in act 502 and not all sub-acts may be implemented by the computing device to complete the process 500. In sub-act 502a, the nonlinear function may be applied to the gradient waveform to obtain a scaled gradient waveform, in some embodiments. For example, the gradient waveform and the nonlinear function may be multiplied together to obtain the scaled gradient waveform.

After sub-act 502a, process 500 may proceed to sub-act 502b, where a transformation may be applied to the scaled gradient waveform to obtain a transformed gradient waveform, in some embodiments. The transformation may be applied to the scaled gradient waveform by filtering the scaled gradient waveform using a filter obtained based on eddy current calibration data (e.g., as described herein including with reference to FIG. 4C).

After sub-act 502b, process 500 may proceed to sub-act 502c, where the scaled gradient waveform may be subtracted from the transformed gradient waveform to obtain a correction waveform, in some embodiments. The correction waveform may then be combined with the gradient waveform at sub-act 502d to obtain a corrected gradient waveform. In some embodiments, the correction waveform and the gradient waveform may be added to obtain the corrected gradient waveform. In some embodiments where multiple nonlinear functions are being used to correct the gradient waveform, as described in connection with FIG. 4F, for example, the resulting correction waveforms and the gradient waveform may be summed to obtain the corrected gradient waveform.

After act 502, process 500 may proceed to act 504, where the MRI system may be operated in accordance with the corrected gradient waveform to generate a target gradient field, in some embodiments. The MRI system may be used, for example, to acquire one or more MR images of a subject positioned within the MRI system using the target gradient field.

The inventors have recognized that the nonlinear function as described above in connection with FIGS. 3A-5 may be implemented as a piecewise function of a characteristic of the gradient waveform, in some embodiments. The transformation may accordingly be determined separately for different portions of the piecewise function. For example, eddy current calibration data may be obtained from the MRI systems for the two portions of the gradient waveform and a nonlinear function (an "eddy current model") may be determined for each portion of the gradient waveform based on the eddy current calibration data. Accordingly, two transformations may be determined based on the two nonlinear functions, and the transformations may be applied to the corresponding portions of the gradient waveform to yield a corrected gradient waveform. It may be appreciated that the above description is an example, and the gradient waveform may be split into more than two portions for correction using a piecewise function.

In some embodiments, the portions of the gradient waveform may be determined using a piecewise function of a characteristic of the gradient waveform. For example, the piecewise function may be a function of the amplitude of the gradient waveform. The first portion of the gradient waveform may include gradient waveforms with amplitudes that are less than or equal to a threshold gradient field strength, and the second portion of the gradient waveform may include gradient waveforms with amplitudes that are greater than the threshold gradient field strength. The threshold gradient field strength may be a threshold percentage of the maximum gradient field strength of the MRI system (e.g., 70% of the maximum gradient field strength, within a range from 60% to 80% of the maximum gradient field strength) in some embodiments. The threshold gradient field strength may, in some embodiments, be greater than or equal to 10 mT/m and less than or equal to 18 mT/m.

Alternatively, for example, the portions of the gradient waveform may be determined based on a piecewise function of a direction of the gradient waveform, in some embodiments. The first portion of the gradient waveform may include gradient waveforms configured to generate magnetic fields having a first direction, and the second portion may include gradient waveforms configured to generate magnetic fields having a second, different direction. In embodiments where the gradient magnets are gradient coils, for example, the first portion may include gradient waveforms configured to generate magnetic fields using a positive electric current, and the second portion may include gradient waveforms to generate magnetic fields using a negative electric current.

Alternatively, for example, the portions of the gradient waveform may be determined based on a piecewise function of a shape of the gradient waveform, in some embodiments. The first portion of the gradient waveform may include gradient waveforms having a first shape, and the second portion of the gradient waveform may include gradient waveforms having a second shape different than the first shape. For example, the shapes of the gradient waveforms may be one of a trapezoidal gradient waveform shape, a rectangular gradient waveform shape, a Gaussian gradient waveform shape, or a sinusoidal gradient waveform shape.

Alternatively, for example, the portions of the gradient waveform may be determined based on a piecewise function of a slew rate of the gradient waveform, in some embodiments. The first portion of the gradient waveform may include gradient waveforms include gradient waveforms having a first slew rate, and the second portion may include gradient waveforms having a second slew rate than the first slew rate. For example, the slew rate of the first portion may be greater than a threshold slew rate, and the slew rate of the second portion may be less than or equal to a threshold slew rate.

In some embodiments, the nonlinear function may be determined based on the eddy current calibration data acquired for the portions of the gradient waveform. For example, if the characteristic of the gradient waveform of interest is the gradient waveform amplitude, the eddy current calibration data may be acquired for two or more gradient waveform amplitudes using a field probe. A nonlinear function may then be determined for each eddy current calibration data set. In some embodiments, each nonlinear function corresponding to a portion of the gradient waveform may be determined using a multi-exponential function as a fit to the eddy current calibration data $$R(t) = \sum_{j=1}^{n} C_j e^{-w_j t}$$

where the coefficients $C_j$ are scalar values. In some embodiments, the multi-exponential function may be a sum of three exponential terms (e.g., n=3), but it may be appreciated that more or fewer exponential terms may be used.

In some embodiments, a transformation may be determined for each portion of the gradient waveform based on each corresponding nonlinear function. The transformations may be used to pre-emphasize the corresponding portions of the gradient waveform (e.g., by convolving the portions with respective pre-emphasis filters) to compensate for eddy current effects during MR imaging.

In some embodiments, each transformation may then be applied to the corresponding portion of the gradient waveform. For example, a first transformation determined based on a first nonlinear function may be applied to a first portion of the gradient waveform, and a second transformation determined based on a second nonlinear function may be applied to a second portion of the gradient waveform. The transformations, in some embodiments, may be applied to the portions of the gradient waveform in a time domain. After applying the transformations to the corresponding portions of the gradient waveform, the transformed portions may be combined to obtain a corrected gradient waveform. For example, the transformed portions may be summed to obtain the corrected gradient waveform.

Figure 6:
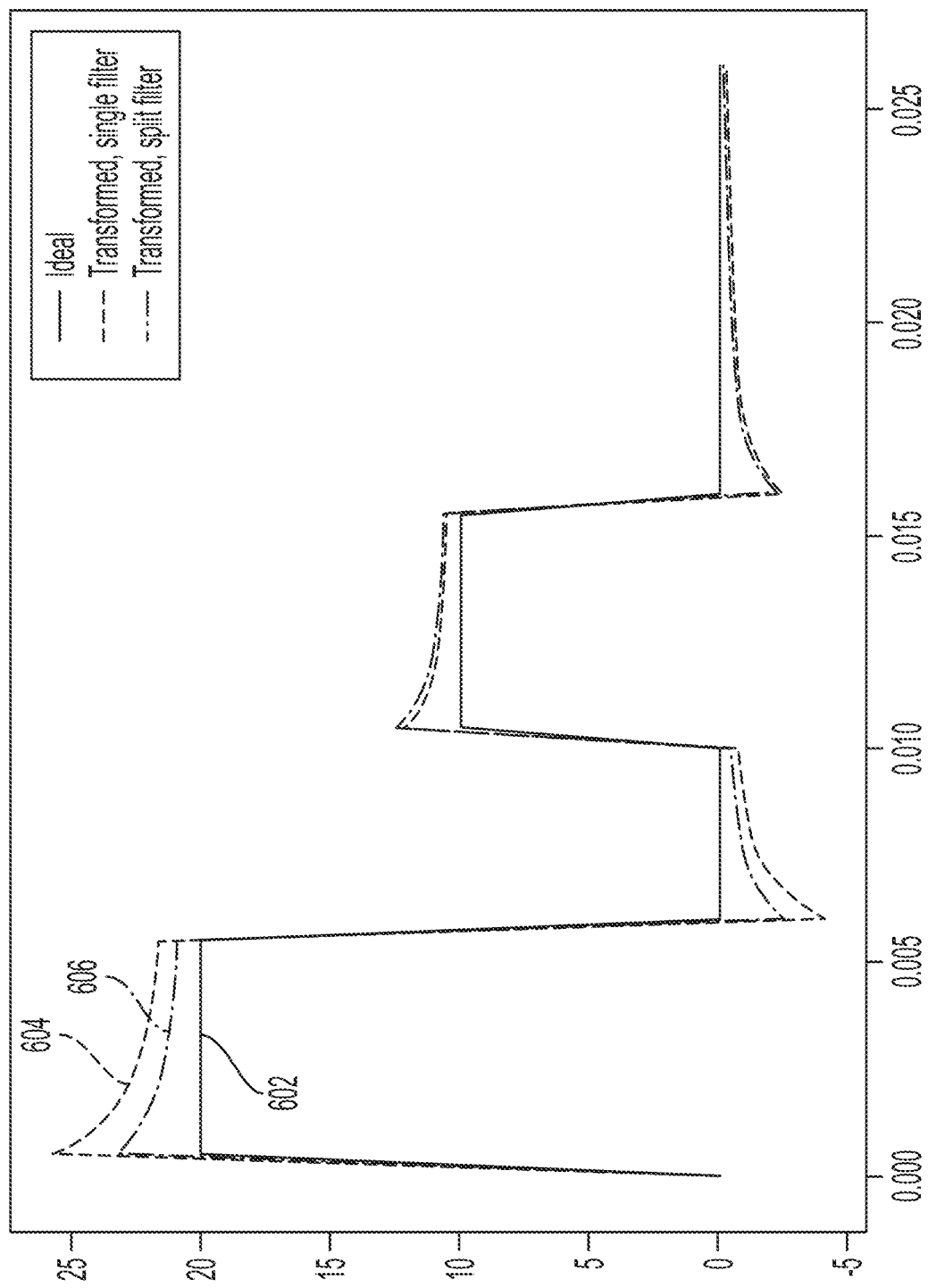
FIG. 6 illustrates a gradient waveform, a corrected gradient waveform obtained using a single transformation, and a corrected gradient waveform obtained by using a piecewise polynomial transformation, in accordance with some embodiments of the technology described herein.

FIG. 6 illustrates a gradient waveform 602, a corrected gradient waveform 604 obtained using a single transformation, and a corrected gradient waveform 606 obtained by using a piecewise transformation as described above, in accordance with some embodiments. As can be seen from the example of FIG. 6, the corrected gradient waveform 604 places a larger weight on large changes in gradient amplitude than the corrected gradient waveform 606. As a result, the corrected gradient waveform 604 may result in an output gradient waveform that "overshoots" the target gradient field represented by gradient waveform 602.

Figures 7A, 7B:
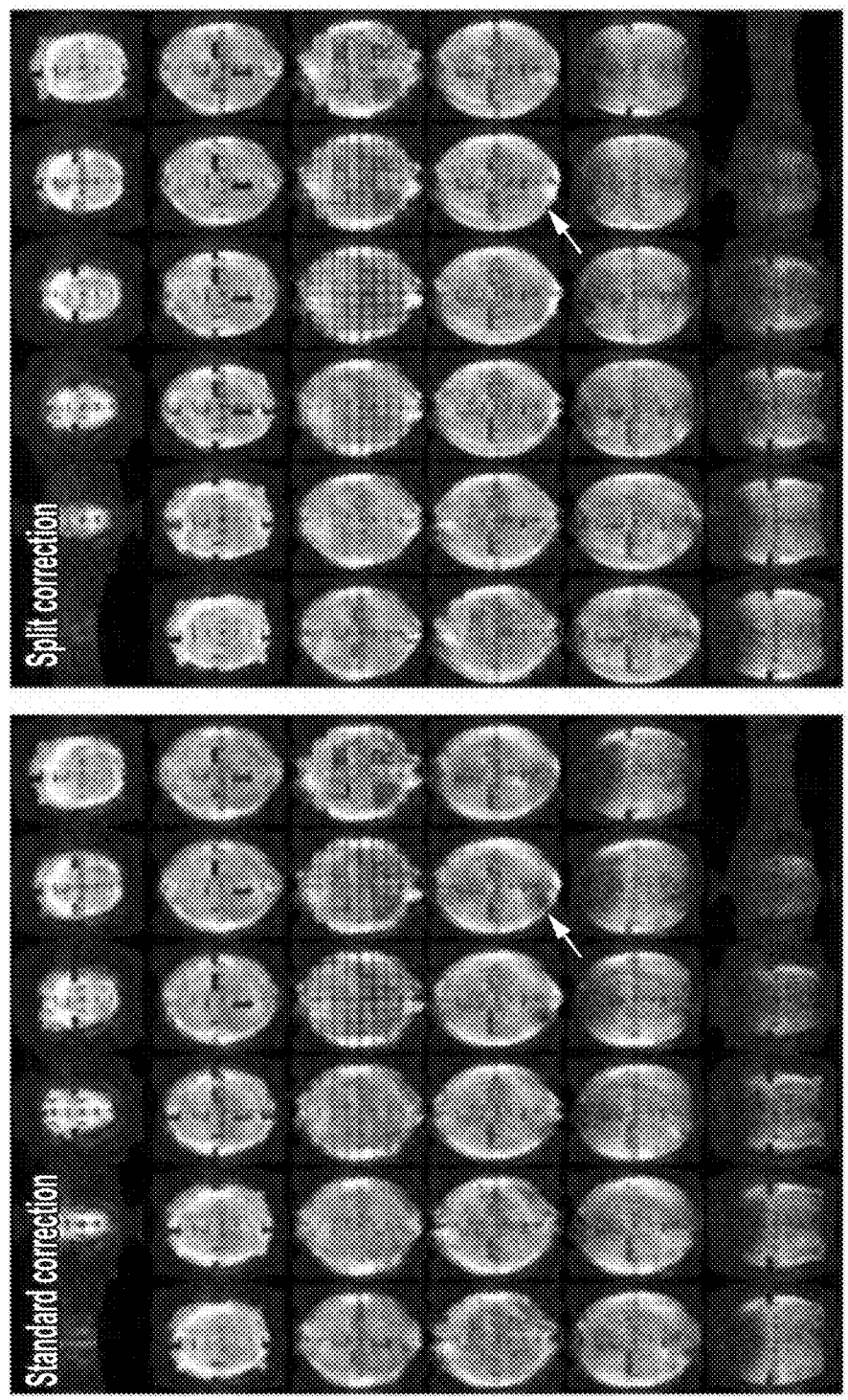
FIG. 7A shows magnetic resonance (MR) images of a phantom acquired with gradient waveforms corrected using a conventional linear correction.
FIG. 7B shows MR images of a phantom acquired with gradient waveforms corrected using a piecewise polynomial transformation, in accordance with some embodiments of the technology described herein.

FIG. 7A shows MR images of a phantom acquired using a gradient waveform that was corrected with a conventional linear correction, and FIG. 7B shows MR images of the same phantom acquired using a gradient waveform that was corrected with a piecewise correction, as described above and in accordance with some embodiments. As pointed to by the arrows in FIGS. 7A and 7B, an artefact in the form of a dark spot appears in some MR images of FIG. 7A but not in the MR images of FIG. 7B.

Figure 8:
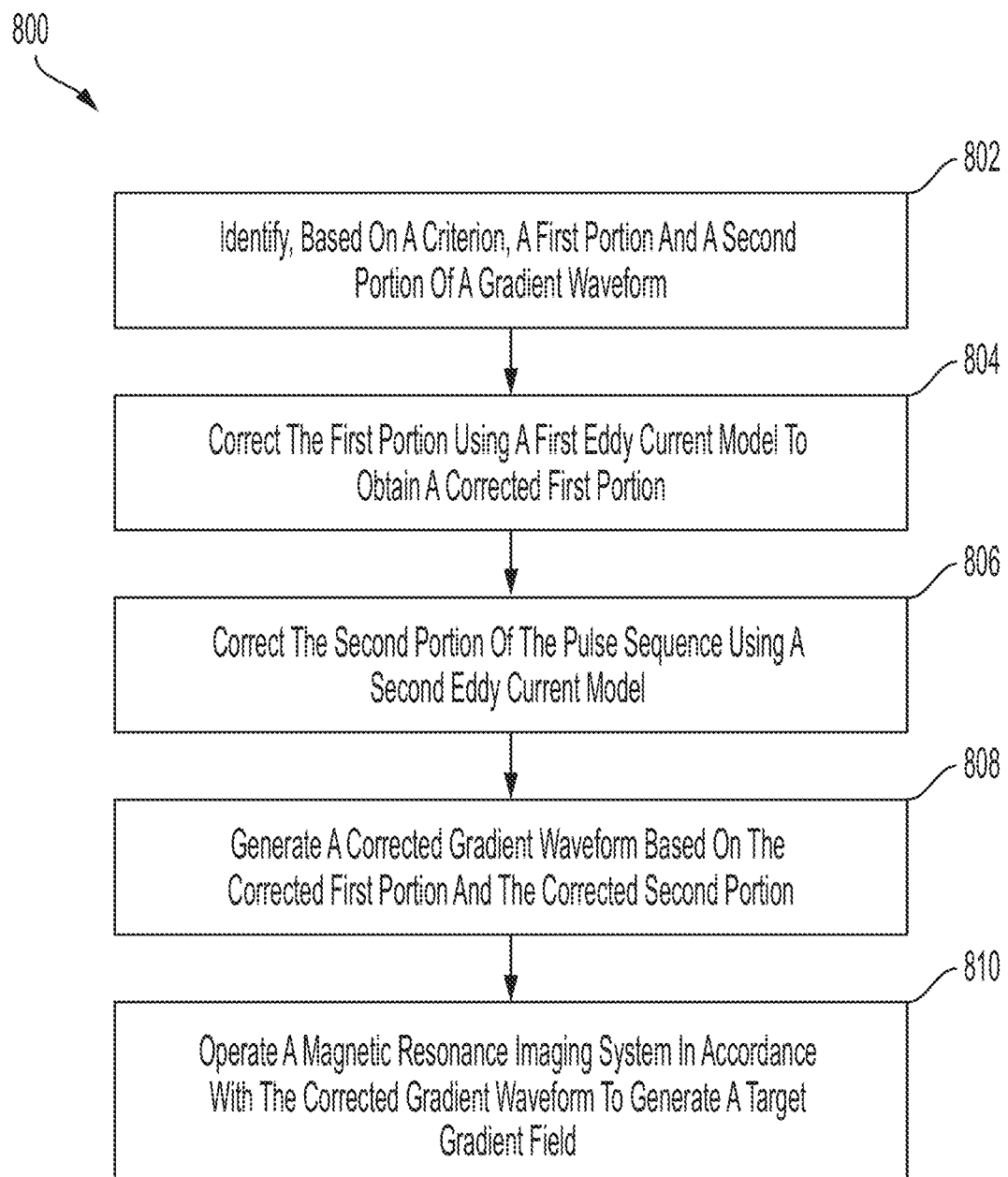
FIG. 8 is a flowchart of a process 800 for correcting a gradient waveform using a piecewise polynomial transformation, in accordance with some embodiments of the technology described herein.

FIG. 8 is a flowchart of a process 800 for correcting a gradient waveform using a piecewise transformation, in accordance with some embodiments. Process 800 may be executed using any suitable computing device. For example, in some embodiments, process 800 may be performed by a computing device co-located (e.g., in the same room) with an MRI system. As another example, in some embodiments, process 800 may be performed by one or more processors located on the MRI system. Alternately, in some embodiments, process 800 may be performed by one or more processors located remotely from the MRI system (e.g., as part of a cloud computing environment).

Process 800 begins at act 802, where the computing device identifies, based on a criterion, a first portion and a second portion of a gradient waveform, in some embodiments. The criterion may be a characteristic of the gradient waveform, as described above. For example, the characteristic may be an amplitude of the gradient waveform, a direction of the gradient waveform, a shape of the gradient waveform, and/or a slew rate of the gradient waveform. For example, in some embodiments where the characteristic is an amplitude of the gradient waveform, the first portion of the gradient waveform may be identified as including gradient waveforms having an amplitude greater than a threshold gradient amplitude, and the second portion of the gradient waveform may be identified as including gradient waveforms having an amplitude less than or equal to the threshold gradient amplitude.

After act 802, process 800 proceeds to act 804, where the computing device corrects the first portion using a first nonlinear function to obtain a corrected first portion, in some embodiments. The first nonlinear function may be obtained using first eddy current calibration data obtained using the MRI system. For example, the first eddy current calibration data may be obtained using a field probe, as described above, to measure eddy current responses above a threshold gradient amplitude. The first nonlinear function may then be determined by fitting any suitable function to the first eddy current calibration data. In some embodiments, the first nonlinear function may be a multi-exponential function (e.g., a linear combination of exponential terms, for example, three exponential terms), as described above.

In some embodiments, correcting the first portion using the first nonlinear function includes using the first nonlinear function to determine a first transformation and then applying said first transformation to the first portion. The first transformation may be a filter configured to, when applied to the first portion, filter the first portion. In some embodiments, the first transformation may be obtained by performing an inverse Laplace transformation on the first nonlinear function.

After act 804, process 800 proceeds to act 806, where the computing device corrects the second portion of the pulse sequence using a second nonlinear function, in some embodiments. The second nonlinear function may be different from the first nonlinear function. The second nonlinear function may be obtained using second eddy current calibration data obtained using the MRI system. The second eddy current calibration data may be different from the first eddy current calibration data. For example, the first eddy current calibration data may be obtained using a field probe, as described above, to measure eddy current responses above a threshold gradient amplitude while the second eddy current calibration data may be obtained using the field probe to measure eddy current responses below a threshold gradient amplitude. The second nonlinear function may then be fit to the second eddy current calibration data using any suitable function. In some embodiments, the second nonlinear function may be a multi-exponential function (e.g., a linear combination of exponential terms, for example, three exponential terms), as described above.

In some embodiments, correcting the second portion using the second nonlinear function includes using the second nonlinear function to determine a second transformation and then applying said second transformation to the second portion. The second transformation may be a filter configured to, when applied to the second portion, filter the second portion. In some embodiments, the second transformation may be obtained by performing an inverse Laplace transformation on the second nonlinear function.

After act 806, process 800 proceeds to act 808, where the computing device generates a corrected gradient waveform based on the corrected first portion and the corrected second portion, in some embodiments. For example, the computing device may combine the corrected first portion and the corrected second portion to obtain the corrected gradient waveform. In some embodiments, combining the corrected first portion and the corrected second portion may be implemented by summing the corrected first portion and the corrected second portion.

After act 808, process 800 proceeds to act 810, where an MRI system may be operated in accordance with the corrected gradient waveform to generate a target gradient field, in some embodiments. For example, the corrected gradient waveform may be transmitted as an electrical signal to one or more gradient coils that generate the target gradient field using the electrical signal.

Eddy current compensation and artefact mitigation can further be improved by correcting the operating frequency of RF components of the MRI system in response to eddy currents generated by MR image acquisition. Eddy currents can cause the $B_0$ magnetic field to change in strength, thereby changing the Larmor frequency of the spins of the subject in the imaging region. By matching these changes of the Larmor frequency with changes in the RF operating frequency of the MRI, higher quality MR data may be obtained by the MRI system. The inventors have recognized that eddy current calibration data may further be used to correct the RF operating frequency of the MRI system during a pulse sequence.

In some embodiments, the field probe may be configured to monitor the $B_0$ magnetic field strength of the MRI system. To obtain $B_0$ eddy current calibration data for correction of the RF operating frequency, a similar sequence of applying a gradient field, waiting for a time delay, and measuring the $B_0$ field after the time delay may be performed. Varying the time delay may enable the collection of $B_0$ eddy current calibration data for various components of the eddy currents (e.g., eddy currents with differing time constants). Based on this $B_0$ eddy current calibration data, a function or functions may be determined describing the effects of gradient amplitude on the $B_0$ field. In some embodiments, this function may be a nonlinear function. For example, the nonlinear function may be a multiexponential function fit to the $B_0$ eddy current calibration data such as:

$$R(t) = c_1 e^{-w_1 t} + c_2 e^{-w_2 t}$$

where $c_1$ and $c_2$ are scalar coefficients and $w_1$ and $w_2$ are time constants associated with components of the eddy currents.

In some embodiments, a transformation may be determined based on the $B_0$ eddy current calibration data. For example, a transformation may be determined based on the nonlinear function determined based on the $B_0$ eddy current calibration data. The transformation may comprise a filter that may be used to filter the corrected gradient waveform to obtain a $B_0$ waveform. The filter may be, for example, obtained using an inverse Laplace transform (e.g., of the nonlinear function). In such embodiments, for the example multiexponential function R(t) above, the filter may be given by:

$$H(s) = -\frac{(c_1 w_2 + c_2 w_1)s + (c_1 + c_2)}{s^2 + (w_1 + w_2)s + w_1 w_2}$$

In some embodiments, this transformation may be applied to the corrected gradient waveform to obtain a $B_0$ waveform describing the $B_0$ magnetic field as a function of time throughout the duration of the pulse sequence. The RF operating frequency may then be determined based on this $B_0$ waveform using the Larmor equation $$\omega = \gamma B_0$$

where $\omega$ is the RF operating frequency and $\gamma$ is the gyromagnetic ratio.

Figure 9A:
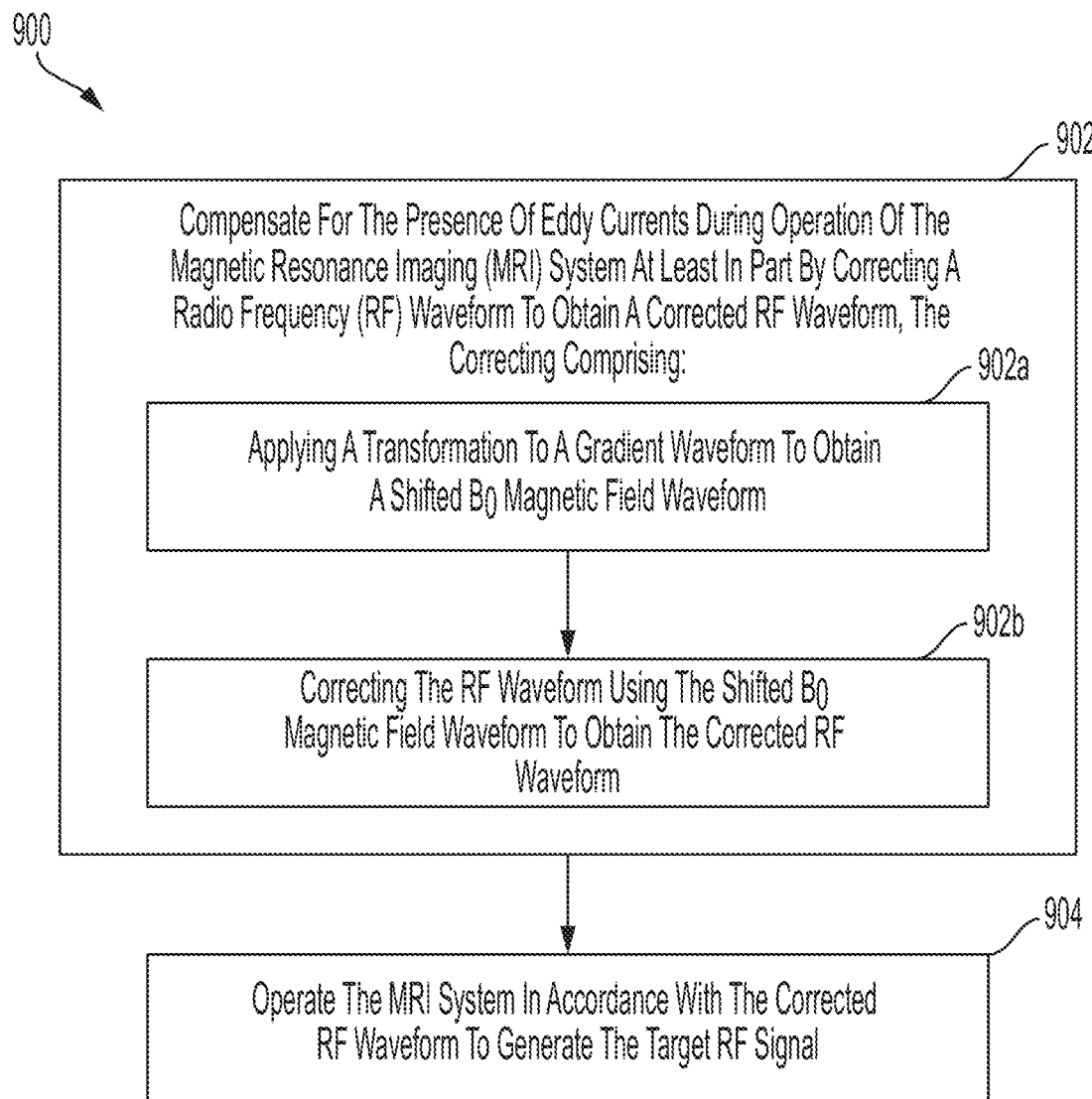
FIG. 9A is a flowchart of a process 900 for correcting an operating frequency of a radio frequency (RF) coil of an MRI system using a nonlinear function, in accordance with some embodiments of the technology described herein.

FIG. 9A is a flowchart of a process 900 for correcting an operating frequency of a radio frequency (RF) coil of an MRI system using a nonlinear function, in accordance with some embodiments. Process 900 may be executed using any suitable computing device. For example, in some embodiments, process 900 may be performed by a computing device co-located (e.g., in the same room) with an MRI system. As another example, in some embodiments, process 900 may be performed by one or more processors located on the MRI system. Alternately, in some embodiments, process 900 may be performed by one or more processors located remotely from the MRI system (e.g., as part of a cloud computing environment).

Process 900 may begin at act 902, where the computing device may compensate for the presence of eddy currents during operation of the MRI system at least in part by correcting an RF waveform to obtain a corrected RF waveform. For example, the computing device may shift the operating frequency of the RF waveform over time during a pulse sequence to compensate for the presence of eddy currents during operation of the MRI system in accordance with the pulse sequence.

Act 902 may be performed as a series of sub-acts, in some embodiments, starting with sub-act 902a, where the computing device may apply a transformation to a gradient waveform to obtain a shifted $B_0$ magnetic field waveform. The shifted $B_0$ magnetic field waveform may describe how the $B_0$ magnetic field varies throughout the pulse sequence (e.g., over time during operation of the MRI system). The transformation may comprise a filter and be applied to the gradient waveform to filter the gradient waveform. In some embodiments, the transformation may be applied to a corrected gradient waveform (e.g., a gradient waveform that has been compensated for the effects of eddy currents as described in connection with any one of FIGS. 2-8).

In some embodiments, the transformation may be determined based on a nonlinear function of a characteristic of the gradient waveform. For example, the nonlinear function may be a function describing a response of the $B_0$ magnetic field as a function of a characteristic of the gradient waveform. The characteristic of the gradient waveform may include any of the amplitude of the gradient waveform, the shape of the gradient waveform, the direction of the gradient waveform, and/or the slew rate of the gradient waveform. The transformation may then be determined by applying a transformation to the nonlinear function. For example, the transformation may be determined by applying an inverse Laplace transformation to the nonlinear function.

Act 902 may then proceed to sub-act 902b, in some embodiments, where the computing device may correct the RF waveform using the shifted $B_0$ magnetic field waveform to obtain a corrected RF waveform. For example, by using the gyromagnetic ratio, as described above, the behavior of the shifted $B_0$ magnetic field waveform may be linked to the RF behavior of the MR signals and the appropriate RF operating frequency of the MRI system throughout a pulse sequence.

After act 902, process 900 may proceed to act 904, where the MRI system may be operated in accordance with the corrected RF waveform to generate a target RF signal. The MRI system may be operated so that the transmit and receive RF operating frequencies are shifted throughout the duration of a pulse sequence in accordance with the corrected RF waveform, as shown in the example of FIG. 9B.

Figure 9B:
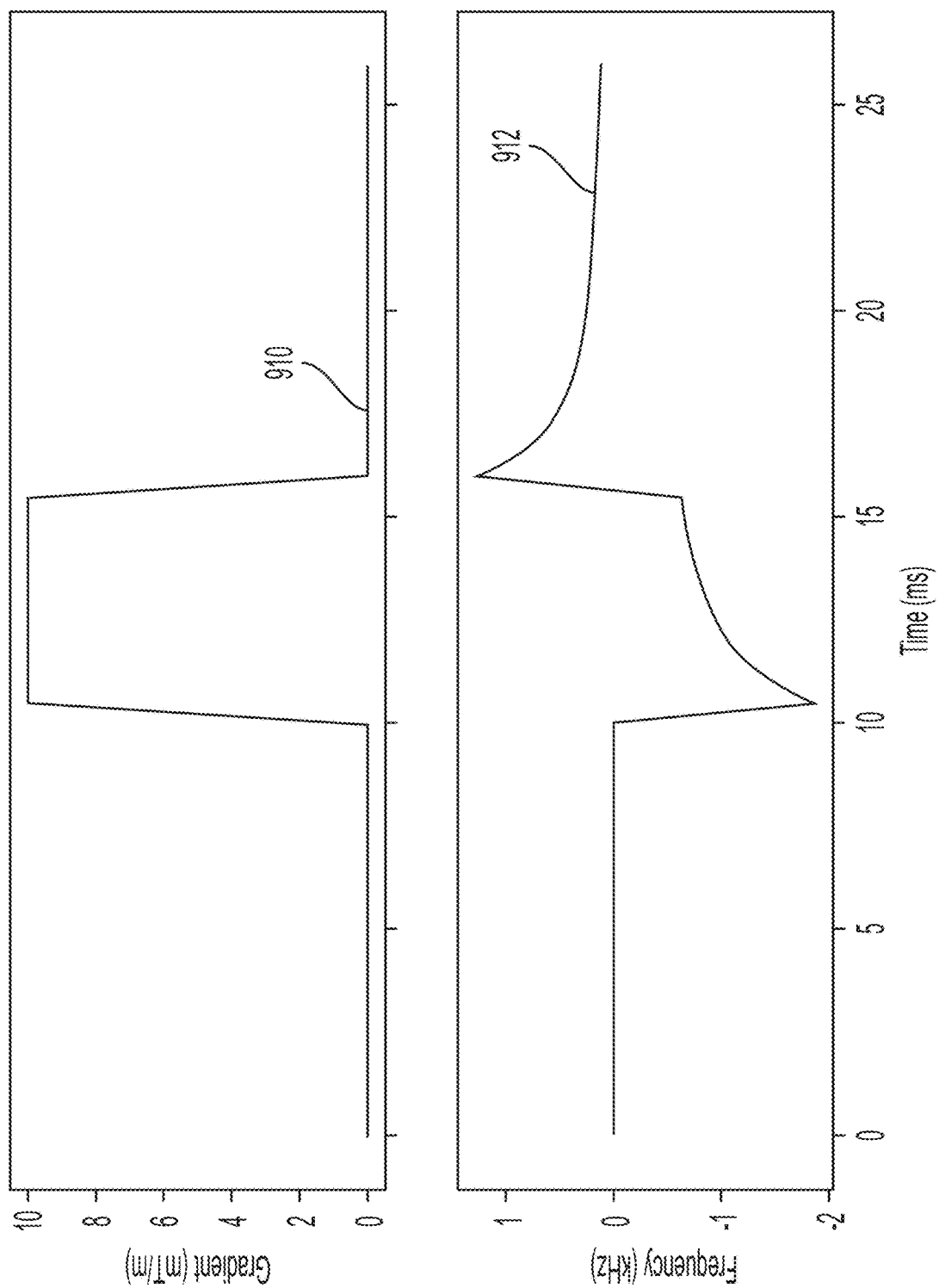
FIG. 9B is an illustration of a gradient pulse waveform and a corresponding eddy current correction of an operating frequency of an RF coil, in accordance with some embodiments of the technology described herein.

FIG. 9B is an illustration of a gradient waveform 910 and a corresponding eddy current correction 912 of an operating frequency of an RF coil, in accordance with some embodiments. The eddy current correction 912 is plotted with respect to time as a change in operating frequency away from the standard RF operating frequency used with no eddy currents present in the MRI system. For example, the standard RF operating frequency may be approximately 2.7 MHz in some embodiments. In some embodiments, the RF operating frequency may be within a range from 2.6 MHz to 2.9 MHz. As shown in the example of FIG. 9B, the RF operating frequency is shifted particularly in response to changes in the gradient waveform 910, which is when the largest eddy currents would be produced within the MRI system.

Figure 9C:
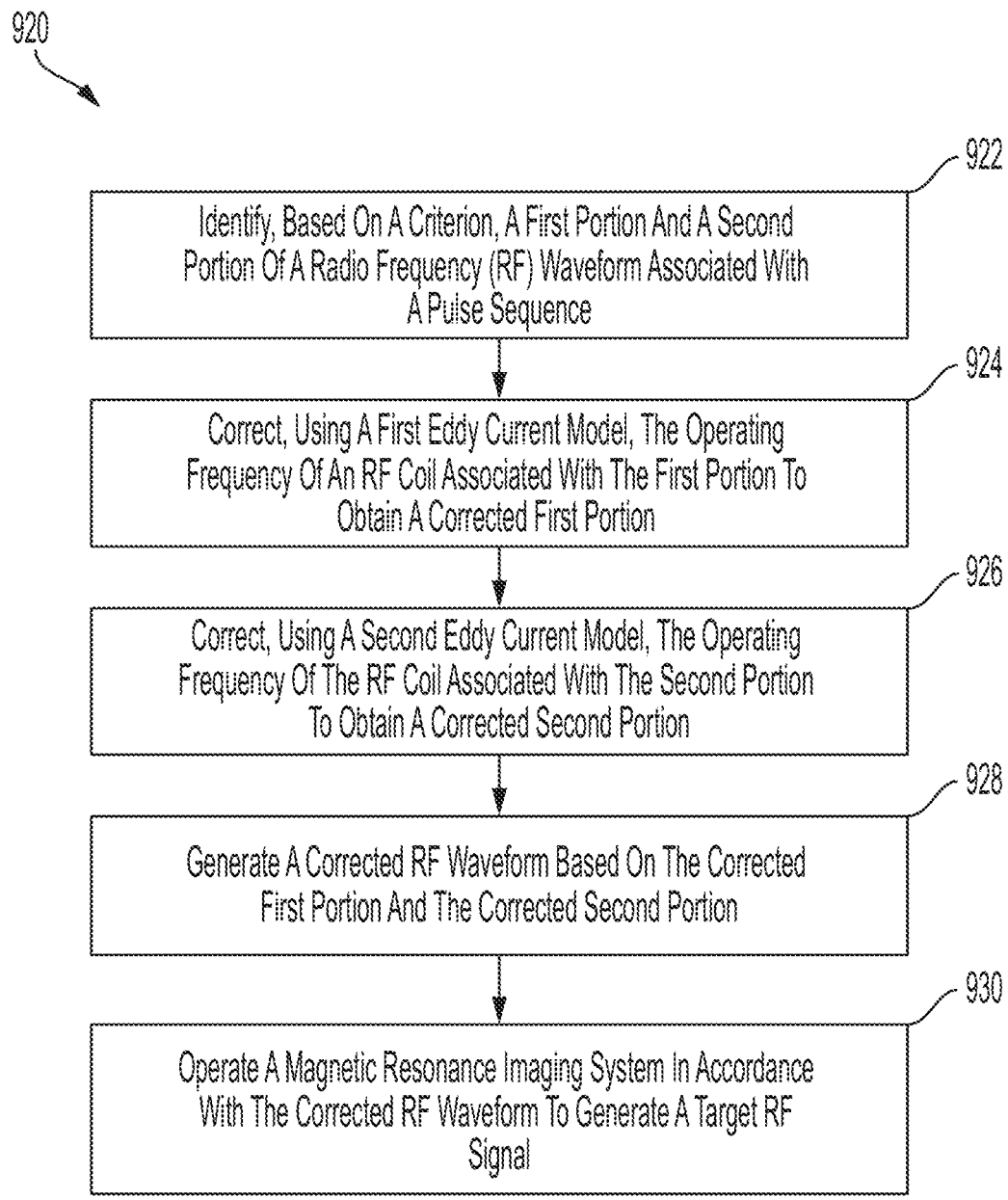
FIG. 9C is a flowchart of a process 920 for correcting an operating frequency of an RF coil of an MRI system using a piecewise transformation, in accordance with some embodiments of the technology described herein.

FIG. 9C is a flowchart of a process 920 for correcting an operating frequency of an RF coil of an MRI system using a piecewise transformation, in accordance with some embodiments. Process 920 may be executed using any suitable computing device. For example, in some embodiments, process 920 may be performed by a computing device co-located (e.g., in the same room) with an MRI system. As another example, in some embodiments, process 920 may be performed by one or more processors located on the MRI system. Alternately, in some embodiments, process 920 may be performed by one or more processors located remotely from the MRI system (e.g., as part of a cloud computing environment).

Process 920 may begin at act 922, where the computing device may identify, based on a criterion, a first portion and a second portion of an RF waveform associated with a pulse sequence. The criterion may be a characteristic of the gradient waveform, as described above. For example, the characteristic of the gradient waveform may be an amplitude of the gradient waveform, a direction of the gradient waveform, a shape of the gradient waveform, and/or a slew rate of the gradient waveform. For example, in some embodiments where the characteristic is an amplitude of the gradient waveform, the first portion of the RF waveform may be identified as corresponding (e.g., occurring at a same time or times) to a first portion of the gradient waveform including gradient waveforms having an amplitude greater than a threshold gradient amplitude, and the second portion of the RF waveform may be identified as corresponding to a second portion of the gradient waveform including gradient waveforms having an amplitude less than or equal to the threshold gradient amplitude.

Process 920 may then proceed to act 924, where the computing device may correct, using a first nonlinear function, the operating frequency of an RF coil associated with the first portion to obtain a corrected first portion, in some embodiments. The first nonlinear function may be obtained using first eddy current calibration data obtained using the MRI system. For example, the first eddy current calibration data may be obtained using a field probe, as described above, to measure $B_0$ magnetic field shifts in response to gradient waveforms having amplitudes above a threshold gradient amplitude. The first nonlinear function may then be fit to the first eddy current calibration data using any suitable function. In some embodiments, the first nonlinear function may be a multi-exponential function (e.g., a linear combination of exponential terms, for example, two or three exponential terms), as described above.

In some embodiments, correcting the first portion using the first nonlinear function includes using the first nonlinear function to determine a first transformation and then applying said first transformation to the first portion of the gradient waveform corresponding to the first portion of the RF waveform. The first transformation may be a filter configured to, when applied to the first portion of the gradient waveform, filter the first portion to obtain a shifted $B_0$ magnetic field waveform. In some embodiments, the first transformation may be obtained by performing an inverse Laplace transformation on the first nonlinear function.

In some embodiments, the computing device may correct the RF waveform using the shifted $B_0$ magnetic field waveform to obtain a corrected RF waveform. For example, by using the gyromagnetic ratio, as described above, the behavior of the shifted $B_0$ magnetic field waveform may be linked to the RF behavior of the MR signals and the appropriate RF operating frequency of the MRI system throughout a pulse sequence.

After act 924, process 920 may proceed to act 926, where the computing device may correct, using a second nonlinear function different than the first nonlinear function, the operating frequency of the RF coil associated with the second portion to obtain a corrected second portion, in some embodiments. The second nonlinear function may be obtained using second eddy current calibration data obtained from the MRI system in a similar manner as the first eddy current calibration data. For example, the first eddy current calibration data may be obtained using a field probe, as described above, to measure $B_0$ magnetic field shifts in response to a gradient waveform above a threshold gradient amplitude while the second eddy current calibration data may be obtained using the field probe to measure $B_0$ magnetic field shifts below a threshold gradient amplitude. The second nonlinear function may then be fit to the second eddy current calibration data using any suitable function. In some embodiments, the second nonlinear function may be a multi-exponential function (e.g., a linear combination of exponential terms, for example, three exponential terms), as described above.

In some embodiments, correcting the second portion using the second nonlinear function includes using the second nonlinear function to determine a second transformation and then applying said second transformation to the second portion of the gradient waveform corresponding to the second portion of the RF waveform. The second transformation may be a filter configured to, when applied to the second portion of the gradient waveform, filter the second portion to obtain a shifted $B_0$ magnetic field waveform. In some embodiments, the second transformation may be obtained by performing an inverse Laplace transformation on the second nonlinear function. In some embodiments, the computing device may correct the RF waveform using the shifted $B_0$ magnetic field waveform to obtain a corrected RF waveform as described above.

After act 926, process 920 may proceed to act 928, where the computing device may generate a corrected RF waveform based on the corrected first portion and the corrected second portion. For example, the computing device may combine the corrected first portion and the corrected second portion to obtain the corrected gradient waveform. In some embodiments, combining the corrected first portion and the corrected second portion may be implemented by summing the corrected first portion and the corrected second portion.

After act 928, process 920 proceeds to act 930, where an MRI system may be operated in accordance with the corrected RF waveform to generate a target RF signal, in some embodiments. For example, the corrected RF waveform may be transmitted as an electrical signal to one or more RF coils that generate the target RF signal using the electrical signal.

Eddy current compensation may further be improved by preparing the eddy current state of the MRI system prior to an MR image acquisition such that uncorrected eddy current effects can be balanced out for subsequent acquisitions. Even after performing eddy current corrections as described above, some eddy currents usually remain within the MRI system. By preparing the eddy current state of the MRI system prior to an MR image acquisition, a more "steady state" eddy current state may be achieved and averaged out of a final MR image. One application that particularly benefits from this method is spin echo diffusion pulse sequences, where large diffusion gradient fields tend to alter the refocusing condition of the spin echo.

Figures 10A, 10B:
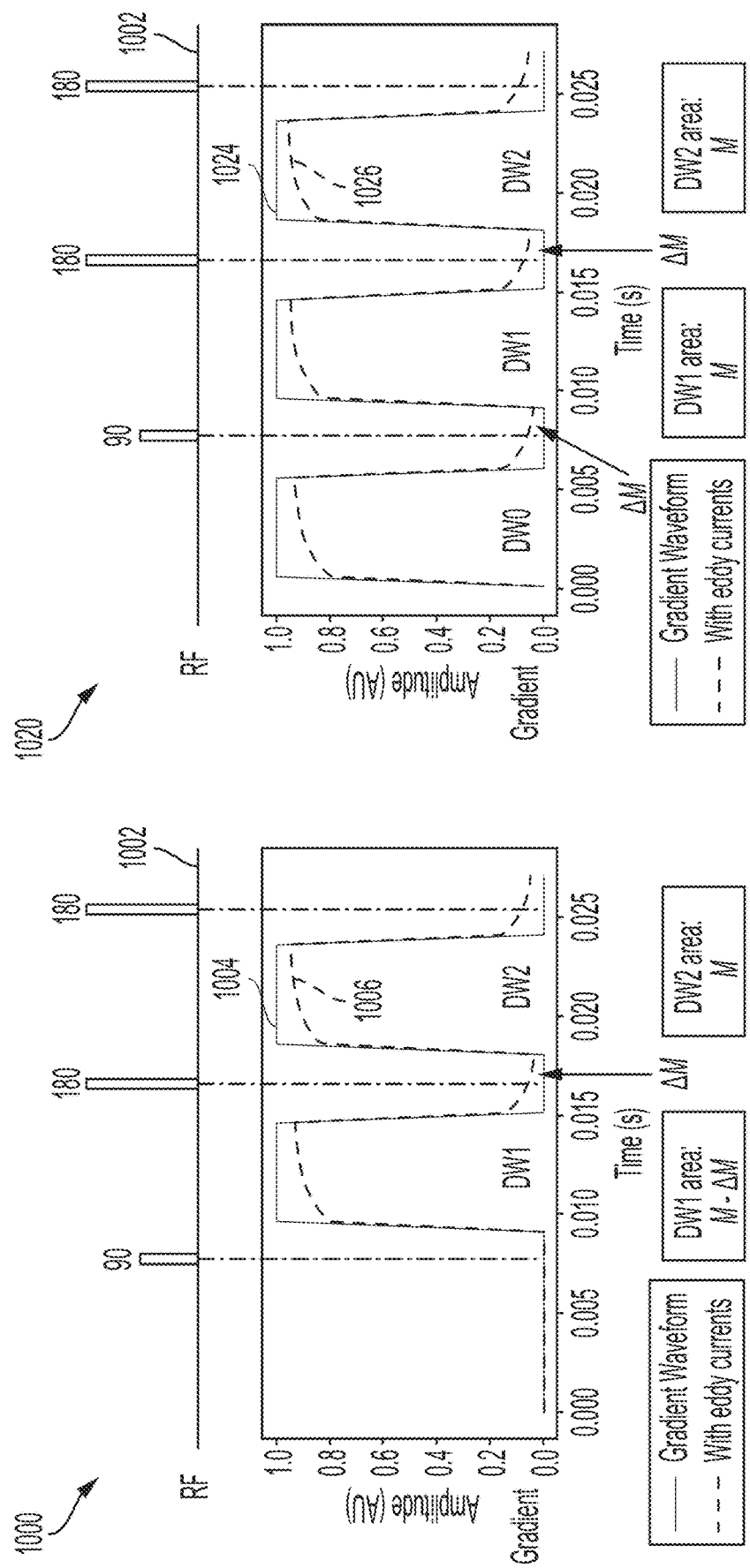
FIG. 10A shows an illustrative pulse sequence including a gradient waveform and a gradient field output as affected by eddy currents in accordance with some embodiments of the technology described herein.
FIG. 10B shows an illustrative pulse sequence including a preparation gradient field pulse, in accordance with some embodiments of the technology described herein.

FIG. 10A shows an illustrative spin echo pulse sequence 1000 including an RF waveform 1002, a gradient waveform 1004 including diffusion pulses DW1 and DW2, and a gradient field output 1006 as affected by eddy currents. The residual eddy currents from the diffusion pulses DW1 and DW2 cause an unbalanced gradient moment (e.g., as described by an integral under the gradient curve) between the two diffusion pulses DW1 and DW2. As shown in FIG. 10A, if the area under pulse DW2 is M, then the area under pulse DW1 is equal to M−ΔM, where ΔM is the area under the gradient field output 1006 prior to DW2 caused by residual eddy currents from DW1. The unbalanced gradient moment between DW1 and DW2 can introduce unwanted phase shifts in subsequent measurements.

FIG. 10B shows an illustrative pulse sequence 1020 including gradient waveform 1024 including a preparation gradient field pulse DW0, in accordance with some embodiments, and a gradient field output 1026 as affected by eddy currents. The preparation gradient field pulse DW0 is the same as diffusion pulses DW1 and DW2 and is generated prior to the diffusion pulses DW1 and DW2 and the 90° RF pulse of RF waveform 1002. The preparation gradient field pulse DW0 balances the gradient moments of DW1 and DW2 such that the area under both diffusion pulses is equal to M. The example of FIG. 10B shows a single preparation gradient field pulse DW0, but it may be appreciated that in some embodiments, the preparation gradient field pulse may include multiple preparation gradient field pulses. For example, if the pulse sequence to be used for MR image acquisition is a complex imaging sequence, it may be beneficial for the preparation gradient field pulses to include the same complex imaging sequence.

Figure 11:
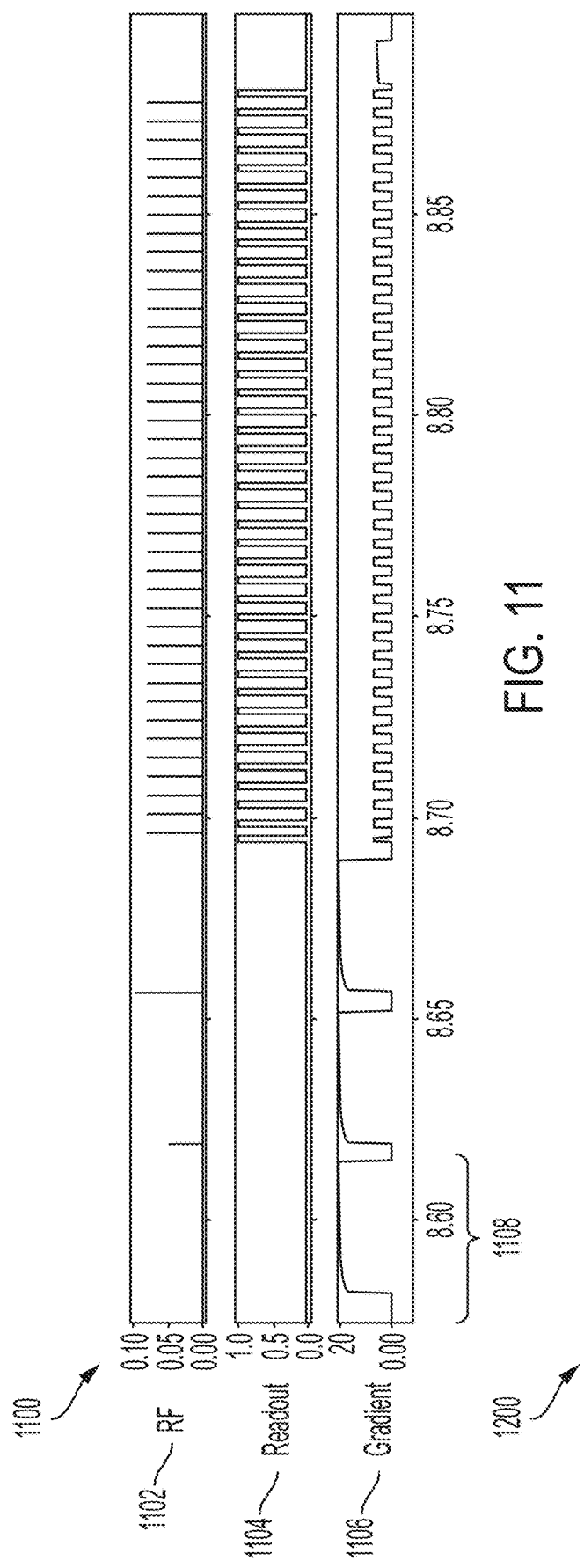
FIG. 11 shows an illustrative diffusion weighted imaging (DWI) monopolar pulse sequence including a preparation gradient field pulse, in accordance with some embodiments of the technology described herein.

FIG. 11 shows an illustrative diffusion weighted imaging (DWI) monopolar pulse sequence 1100 including a preparation gradient field pulse 1108, in accordance with some embodiments. The DWI monopolar pulse sequence 1100 includes an RF waveform 1102, a readout waveform 1104 configured to control the readout of MR signals from the subject, and a gradient waveform 1106. The gradient waveform includes a preparation gradient field pulse 1108 that is the same as the two gradient diffusion pulses that follow the preparation gradient field pulse 1108. Smaller imaging gradient pulses follow after the larger diffusion pulses.

Figure 12:
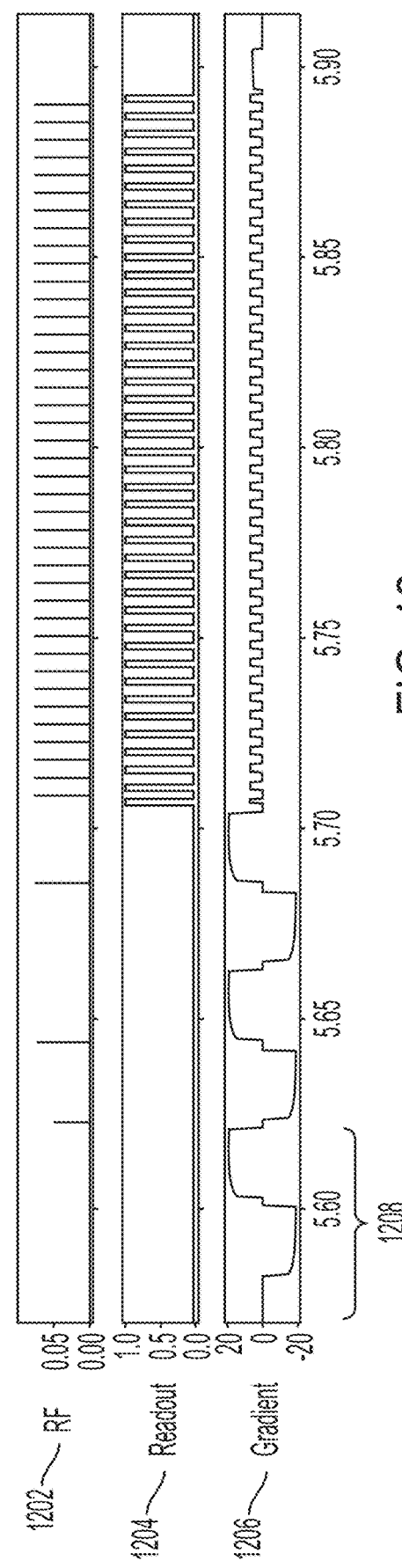
FIG. 12 shows an illustrative DWI bipolar pulse sequence including preparation gradient field pulses, in accordance with some embodiments of the technology described herein.

FIG. 12 shows an illustrative DWI bipolar pulse sequence 1200 including preparation gradient field pulses 1208, in accordance with some embodiments. The DWI bipolar pulse sequence 1200 includes an RF waveform 1202, a readout waveform 1204 configured to control the readout of MR signals from the subject, and a gradient waveform 1206. The gradient waveform includes preparation gradient field pulses 1208 that are the same as two subsequent sequences of gradient diffusion pulses. Smaller imaging gradient pulses follow after the larger diffusion pulses.

Figure 13:
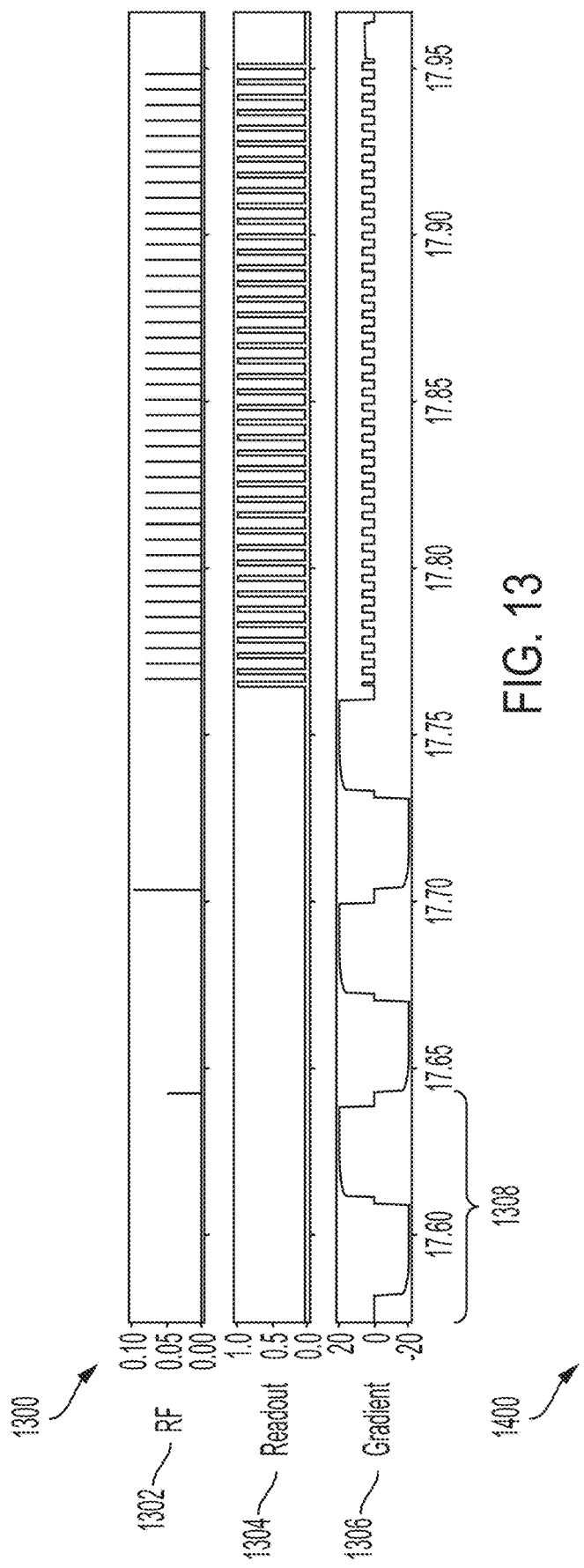
FIG. 13 shows an illustrative DWI motion-compensated pulse sequence including preparation gradient field pulses, in accordance with some embodiments of the technology described herein.

FIG. 13 shows an illustrative DWI motion-compensated pulse sequence 1300 including preparation gradient field pulses 1308, in accordance with some embodiments. The DWI motion-compensated pulse sequence 1300 includes an RF waveform 1302, a readout waveform 1304 configured to control the readout of MR signals from the subject, and a gradient waveform 1306. The gradient waveform includes preparation gradient field pulses 1308 that are the same as two subsequent sequences of gradient diffusion pulses. Smaller imaging gradient pulses follow after the larger diffusion pulses.

Figure 14:
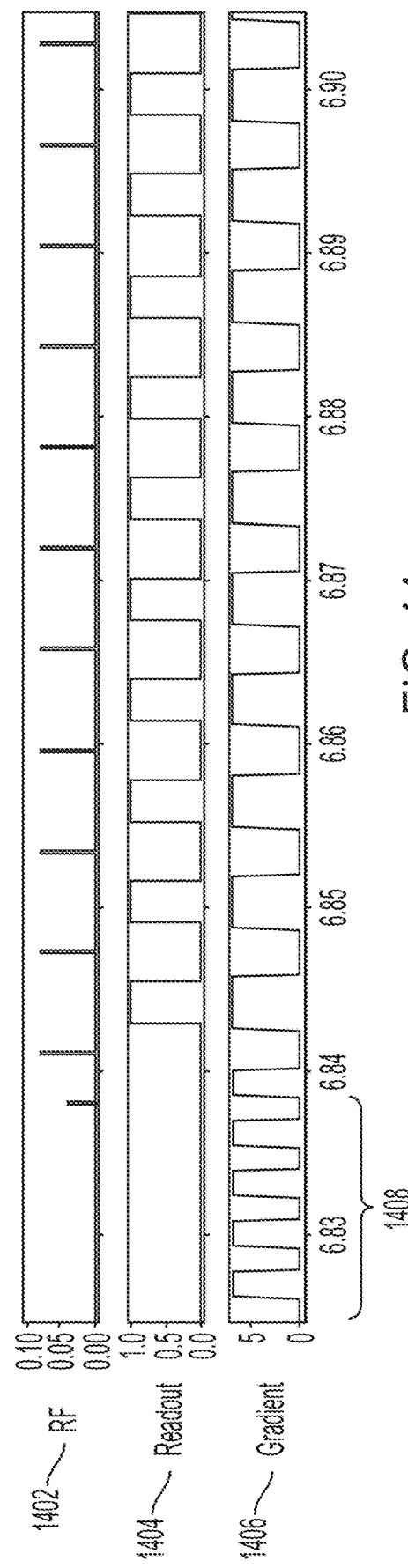
FIG. 14 shows an illustrative fast spin echo (FSE) pulse sequence including preparation gradient field pulses, in accordance with some embodiments of the technology described herein.

FIG. 14 shows an illustrative fast spin echo (FSE) pulse sequence 1400 including preparation gradient field pulses 1408, in accordance with some embodiments. The FSE pulse sequence 1400 includes an RF waveform 1402, a readout waveform 1404 configured to control the readout of MR signals from the subject, and a gradient waveform 1408. The gradient waveform includes preparation gradient field pulses 1408 that are half as wide as subsequent imaging gradient pulses because this pulse sequence is a spin echo pulse sequence, where it is desirable for the spins within the imaging region to refocus in the center of the readout period.

Figure 15:
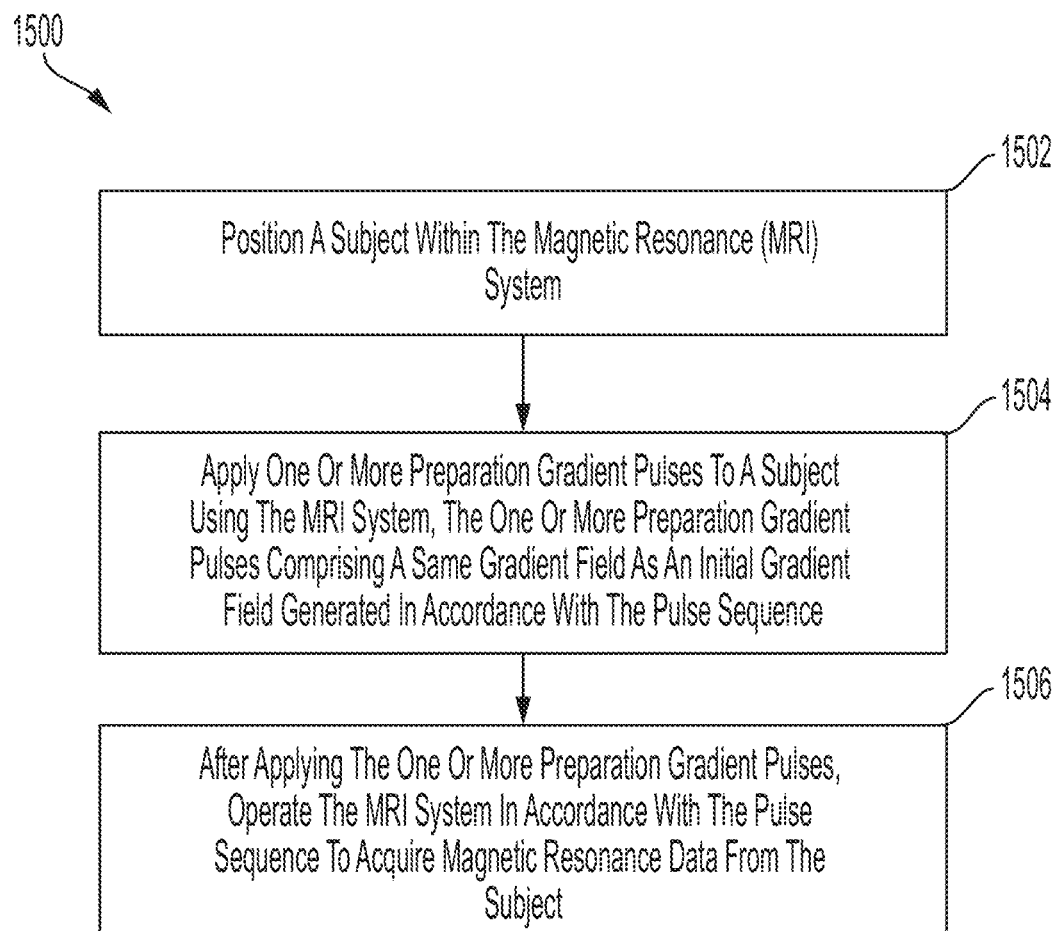
FIG. 15 is a flowchart of a process 1500 of operating an MRI system using preparation gradient field pulses, in accordance with some embodiments of the technology described herein.

FIG. 15 is a flowchart of a process 1500 of operating an MRI system using preparation gradient field pulses, in accordance with some embodiments. Process 1500 may be executed using any suitable computing device. For example, in some embodiments, process 1500 may be performed by a computing device co-located (e.g., in the same room) with an MRI system. As another example, in some embodiments, process 1500 may be performed by one or more processors located on the MRI system. Alternately, in some embodiments, process 1500 may be performed by one or more processors located remotely from the MRI system (e.g., as part of a cloud computing environment).

Process 1500 begins at act 1502, where a subject may be positioned within the MRI system, in some embodiments. The patient may be positioned so that the portion of the patient's anatomy that is to be imaged is placed within an imaging region of the MRI system. For example, the patient's head may be positioned within the imaging region of the MRI system in order to obtain one or more images of the patient's brain.

After act 1502, process 1500 may proceed to act 1504, where one or more preparation gradient field pulses may be applied to the subject using the MRI system, in some embodiments. The one or more preparation gradient field pulses may include a same gradient field as an initial gradient field generated in accordance with the pulse sequence. In some embodiments, the one or more preparation gradient field pulses may include a plurality of gradient fields that are the same as an initial sequence of gradient fields generated in accordance with the pulse sequence. In other embodiments, the one or more preparation gradient field pulses may include one or more gradient fields having a duration that is a portion (e.g., a half, a quarter) of a duration of gradient fields generated in accordance with the pulse sequence.

After act 1504, process 1500 may proceed to act 1506, where, after applying the one or more preparation gradient field pulses, the MRI system may be operated in accordance with the pulse sequence to acquire MR data from the subject. The pulse sequence may include one of a DWI pulse sequence, a DW-SSFP pulse sequence, or an FSE pulse sequence.

Figure 16:
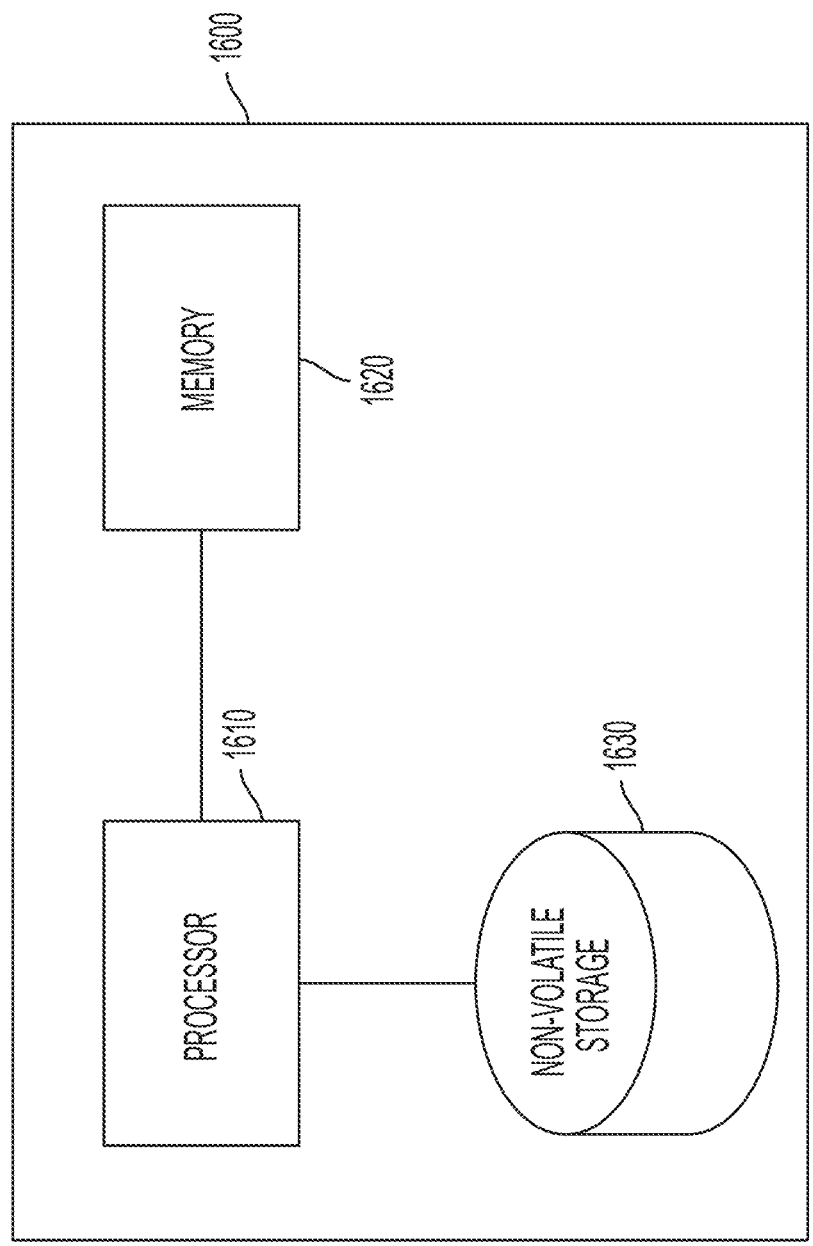
FIG. 16 is a diagram of an illustrative computer system on which embodiments described herein may be implemented.

FIG. 16 is a diagram of an illustrative computer system on which embodiments described herein may be implemented. An illustrative implementation of a computer system 1600 that may be used in connection with any of the embodiments of the disclosure provided herein is shown in FIG. 16. For example, the processes described with reference to FIGS. 4F, 5, 8, 9A, 9C, and 15 may be implemented on and/or using computer system 1600. The computer system 1600 may include one or more processors 1610 and one or more articles of manufacture that comprise non-transitory computer-readable storage media (e.g., memory 1620 and one or more non-volatile storage media 1630). The processor 1610 may control writing data to and reading data from the memory 1620 and the non-volatile storage device 1630 in any suitable manner, as the aspects of the disclosure provided herein are not limited in this respect. To perform any of the functionality described herein, the processor 1610 may execute one or more processor-executable instructions stored in one or more non-transitory computer-readable storage media (e.g., the memory 1620), which may serve as non-transitory computer-readable storage media storing processor-executable instructions for execution by the processor 1610.

Having thus described several aspects and embodiments of the technology set forth in the disclosure, it is to be appreciated that various alterations, modifications, and improvements will readily occur to those skilled in the art. Such alterations, modifications, and improvements are intended to be within the spirit and scope of the technology described herein. For example, those of ordinary skill in the art will readily envision a variety of other means and/or structures for performing the function and/or obtaining the results and/or one or more of the advantages described herein, and each of such variations and/or modifications is deemed to be within the scope of the embodiments described herein. Those skilled in the art will recognize or be able to ascertain using no more than routine experimentation many equivalents to the specific embodiments described herein. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, kits, and/or methods described herein, if such features, systems, articles, materials, kits, and/or methods are not mutually inconsistent, is included within the scope of the present disclosure.

The above-described embodiments can be implemented in any of numerous ways. One or more aspects and embodiments of the present disclosure involving the performance of processes or methods may utilize program instructions executable by a device (e.g., a computer, a processor, or other device) to perform, or control performance of, the processes or methods. In this respect, various inventive concepts may be embodied as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other tangible computer storage medium) encoded with one or more programs that, when executed on one or more computers or other processors, perform methods that implement one or more of the various embodiments described above. The computer readable medium or media can be transportable, such that the program or programs stored thereon can be loaded onto one or more different computers or other processors to implement various ones of the aspects described above. In some embodiments, computer readable media may be non-transitory media.

The terms "program" or "software" are used herein in a generic sense to refer to any type of computer code or set of computer-executable instructions that can be employed to program a computer or other processor to implement various aspects as described above. Additionally, it should be appreciated that according to one aspect, one or more computer programs that when executed perform methods of the present disclosure need not reside on a single computer or processor, but may be distributed in a modular fashion among a number of different computers or processors to implement various aspects of the present disclosure.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

When implemented in software, the software code can be executed on any suitable processor or collection of processors, whether provided in a single computer or distributed among multiple computers.

Further, it should be appreciated that a computer may be embodied in any of a number of forms, such as a rack-mounted computer, a desktop computer, a laptop computer, or a tablet computer, as non-limiting examples. Additionally, a computer may be embedded in a device not generally regarded as a computer but with suitable processing capabilities, including a Personal Digital Assistant (PDA), a smartphone, a tablet, or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible formats.

Such computers may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

The terms "approximately" and "about" may be used to mean within ±20% of a target value in some embodiments, within ±10% of a target value in some embodiments, within ±5% of a target value in some embodiments, within ±2% of a target value in some embodiments. The terms "approximately" and "about" may include the target value.

What is claimed is:

1. A method of operating a magnetic resonance imaging (MRI) system, the MRI system including at least one radio frequency (RF) coil configured to apply an RF signal in accordance with a pulse sequence, the pulse sequence comprising a gradient waveform associated with a target gradient field and an RF waveform associated with a target RF signal, the method comprising:
    compensating for a presence of eddy currents during operation of the MRI system at least in part by correcting the RF waveform to obtain a corrected RF waveform, the correcting comprising:
        determining a shifted $B_0$ magnetic field strength waveform based on a corrected gradient waveform obtained at least in part by applying a first nonlinear function of a characteristic of the gradient waveform to the gradient waveform; and
        correcting the RF waveform using the shifted $B_0$ magnetic field strength waveform to obtain the corrected RF waveform; and
    operating the MRI system in accordance with the corrected RF waveform to generate the target RF signal.

2. The method of claim 1, wherein determining the shifted $B_0$ magnetic field strength waveform comprises applying a first transformation to the corrected gradient waveform to obtain the shifted $B_0$ magnetic field strength waveform.

3. The method of claim 2, wherein applying the first transformation to the corrected gradient waveform comprises filtering the corrected gradient waveform with a first filter determined using the first nonlinear function.

4. The method of claim 1, further comprising determining the first nonlinear function based on first eddy current calibration data obtained from the MRI system, the first eddy current calibration data describing a $B_0$ magnetic field strength as a function of the characteristic of the gradient waveform.

5. The method of claim 1, wherein the method further comprises:
    compensating for the presence of eddy currents during operation of the MRI system at least in part by correcting the gradient waveform using a second nonlinear function of a characteristic of the gradient waveform to obtain a corrected gradient waveform; and
    operating the MRI system in accordance with the corrected gradient waveform to generate the target gradient field.

6. The method of claim 5, wherein the characteristic of the gradient waveform comprises an amplitude of the gradient waveform, a direction of the target gradient field, shape of the gradient waveform, and/or slew rate of the gradient waveform.

7. The method of claim 5, wherein the second nonlinear function is a polynomial function, an exponential function, a piecewise polynomial function, or a piecewise constant function of the characteristic of the gradient waveform.

8. The method of claim 5, wherein the second nonlinear function is determined based on second eddy current calibration data obtained from the MRI system.

9. The method of claim 8, further comprising:
obtaining the second eddy current calibration data using a field probe to measure eddy currents in the MRI system during its operation; and
determining the second nonlinear function using the second eddy current calibration data.

10. The method of claim 5, wherein correcting the gradient waveform comprises:
applying the second nonlinear function to the gradient waveform to obtain a scaled gradient waveform; and
applying a second transformation to the scaled gradient waveform to obtain a transformed gradient waveform, the second transformation being determined using second eddy current calibration data obtained from the MRI system.

11. The method of claim 10, wherein applying the second transformation to the scaled gradient waveform comprises filtering the scaled gradient waveform with a filter determined using the second eddy current calibration data.

12. The method of claim 11, wherein filtering the scaled gradient waveform is performed in a time domain at least in part by performing a convolution.

13. The method of claim 11, wherein filtering the scaled gradient waveform is performed in a domain other than a time domain.

14. The method of claim 11, wherein the filter is a pre-emphasis filter, and the method further comprises determining the pre-emphasis filter using an inverse Laplace transformation.

15. The method of claim 10, further comprising:
subtracting the scaled gradient waveform from the transformed gradient waveform to obtain a correction waveform; and
combining the correction waveform with the gradient waveform to obtain the corrected gradient waveform.

16. The method of claim 15, wherein the first nonlinear function is a nonlinear function for compensating for first eddy currents and the second nonlinear function is a nonlinear function for compensating for second eddy currents, wherein the compensating comprises:
compensating for the presence of eddy currents using multiple nonlinear functions of the characteristic of the gradient waveform to obtain a corrected gradient waveform, the multiple nonlinear functions including the first nonlinear function and the second nonlinear function.

17. The method of claim 5, wherein operating the MRI system in accordance with the corrected gradient waveform comprises generating one or more preparation gradient field pulses prior to generating the target gradient field.

18. The method of claim 1, wherein the pulse sequence comprises one of a diffusion weighted imaging (DWI) pulse sequence, a diffusion weighted steady-state free precession (DW-SSFP) pulse sequence, or a fast spin echo (FSE) pulse sequence.

19. At least one non-transitory computer-readable storage medium storing processor-executable instructions that, when executed by a magnetic resonance imaging (MRI) system, cause the MRI system to perform a method of operating the MRI system by applying a plurality of RF signals in accordance with a pulse sequence, the pulse sequence comprising a gradient waveform associated with a target gradient field and an RF waveform associated with a target RF signal, the method comprising:
compensating for a presence of eddy currents during operation of the MRI system at least in part by correcting the RF waveform to obtain a corrected RF waveform, the correcting comprising:
determining a shifted $B_0$ magnetic field strength waveform based on a corrected gradient waveform obtained at least in part by applying a first nonlinear function of a characteristic of the gradient waveform to the gradient waveform; and
correcting the RF waveform using the shifted $B_0$ magnetic field strength waveform to obtain the corrected RF waveform; and
operating the MRI system in accordance with the corrected RF waveform to generate the target RF signal.

20. A magnetic resonance imaging (MRI) system, comprising:
at least one controller configured to operate one or more of a plurality of magnetics components in accordance with a pulse sequence, the pulse sequence comprising a gradient waveform associated with a target gradient field and an RF waveform associated with a target RF signal, wherein the at least one controller is configured to:
compensate for a presence of eddy currents during operation of the MRI system at least in part by correcting the RF waveform to obtain a corrected RF waveform, the correcting comprising:
determining a shifted $B_0$ magnetic field strength waveform based on a corrected gradient waveform obtained at least in part by applying a first nonlinear function of a characteristic of the gradient waveform to the gradient waveform; and
correcting the RF waveform using the shifted $B_0$ magnetic field strength waveform to obtain the corrected RF waveform; and
operate the MRI system in accordance with the corrected RF waveform to generate the target RF signal.

* * * * *